(12) United States Patent
Wakita et al.

(10) Patent No.: US 9,768,042 B2
(45) Date of Patent: Sep. 19, 2017

(54) SUBSTRATE PROCESSING METHOD AND SUBSTRATE PROCESSING APPARATUS

(71) Applicant: SCREEN Holdings Co., Ltd., Kyoto (JP)

(72) Inventors: Asuka Wakita, Kyoto (JP); Ayumi Higuchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/716,966

(22) Filed: May 20, 2015

(65) Prior Publication Data
US 2015/0340251 A1    Nov. 26, 2015

(30) Foreign Application Priority Data
May 21, 2014 (JP) ................................ 2014-105471

(51) Int. Cl.
H01L 21/02 (2006.01)
H01L 21/306 (2006.01)
H01L 21/67 (2006.01)
H01L 21/687 (2006.01)

(52) U.S. Cl.
CPC .... *H01L 21/6708* (2013.01); *H01L 21/30604* (2013.01); *H01L 21/6715* (2013.01); *H01L 21/67051* (2013.01); *H01L 21/68728* (2013.01); *H01L 21/0209* (2013.01); *H01L 21/02052* (2013.01)

(58) Field of Classification Search
None
See application file for complete search history.

(56) References Cited

U.S. PATENT DOCUMENTS

| 6,003,527 | A | * | 12/1999 | Netsu | B08B 3/02 134/1.3 |
| 8,759,229 | B2 | * | 6/2014 | Koyata | C30B 25/02 216/101 |
| 2006/0234503 | A1 | * | 10/2006 | Yamada | B08B 3/02 438/667 |
| 2011/0240067 | A1 | * | 10/2011 | Kishimoto | H01L 21/02087 134/33 |
| 2012/0090649 | A1 | | 4/2012 | Takahashi et al. | 134/33 |
| 2013/0052360 | A1 | * | 2/2013 | Maegawa | B05B 17/0607 427/421.1 |
| 2013/0078381 | A1 | * | 3/2013 | Miyagi | H01L 21/67051 427/345 |

(Continued)

*Primary Examiner* — Shamim Ahmed
(74) *Attorney, Agent, or Firm* — Ostrolenk Faber LLP

(57) ABSTRACT

A substrate processing method is implemented in a substrate processing apparatus including a substrate holding and rotating unit having a spin base rotatable about a predetermined vertical axis, and a processing cup surrounding the substrate holding and rotating unit and arranged to receive processing liquid splattering from the substrate rotated by the substrate holding and rotating unit, the substrate processing method including a substrate rotating step of rotating the spin base to rotate the substrate about the vertical axis at a predetermined liquid processing speed and, in parallel with the substrate rotating step, a processing liquid supplying step of supplying processing liquid onto the lower surface of the substrate at a predetermined first flow rate and supplying processing liquid onto the upper surface of the substrate at a second flow rate that is higher than the first flow rate.

10 Claims, 12 Drawing Sheets

(56) References Cited

U.S. PATENT DOCUMENTS

2013/0318812 A1\* 12/2013 Kim ..................... F26B 21/12
 34/282
2014/0051259 A1\* 2/2014 Shibayama ....... H01L 21/30604
 438/748

\* cited by examiner

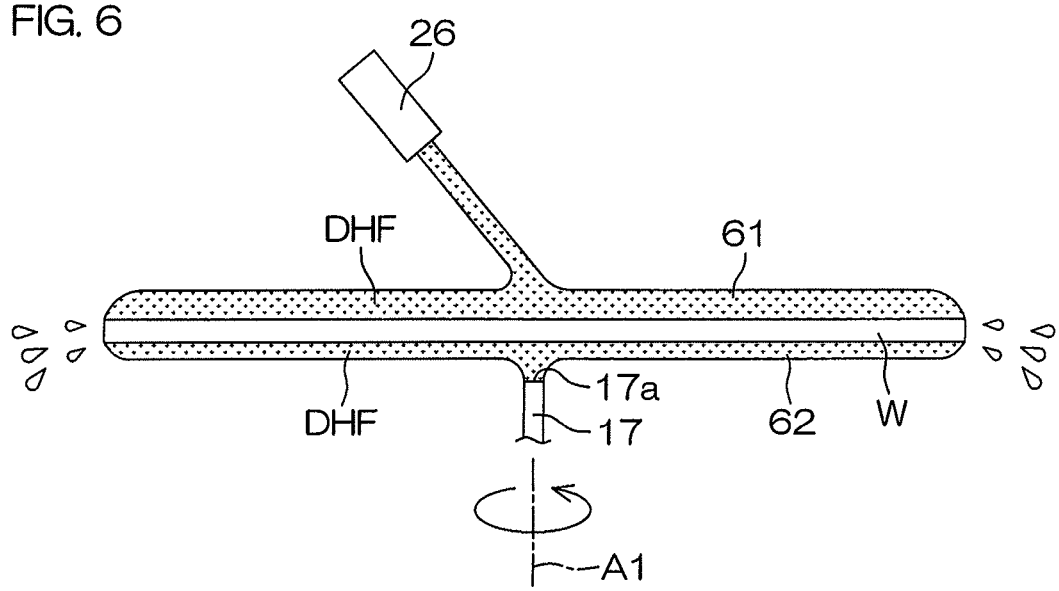
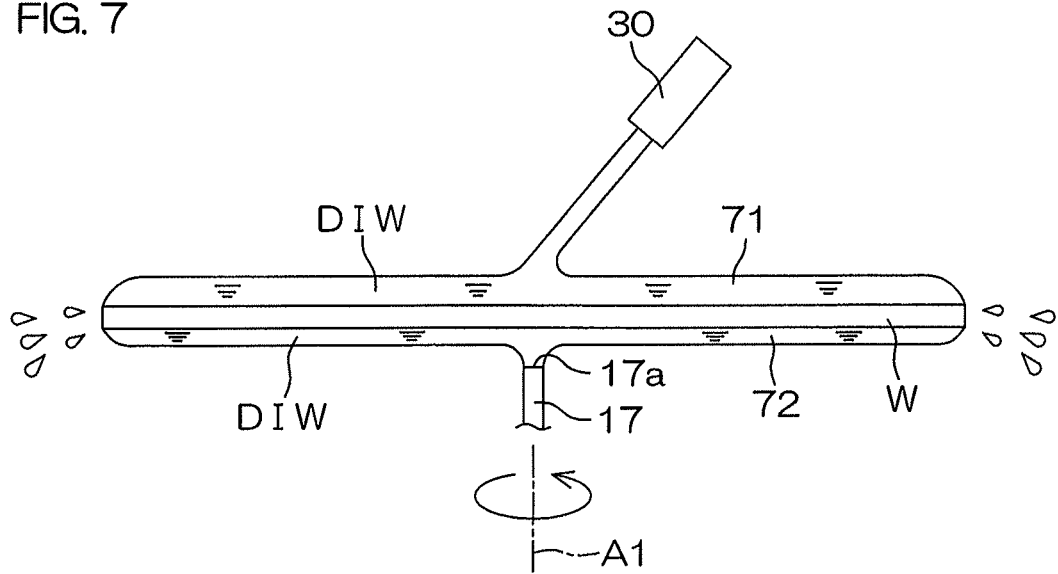

FIG. 17

| Rotation speed (rpm) | Back side flow rate (L/min) | | |
|---|---|---|---|
| | 2.0 | 1.5 | 1.0 |
| 1200 | ○ | ○ | ○ |
| 800 | ○ | ○ | ○ |
| 600 | ○ | ○ | ○ |
| 500 | ○ | ○ | ○ |
| 400 | ○ | ○ | × |

○ : Good
× : Insufficient

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus. Examples of substrates to be processed include semiconductor wafers, substrates for liquid crystal display devices, substrates for plasma display devices, substrates for FEDs (Field Emission Display devises), substrates for optical disks, substrates for magnetic disks, substrates for magneto-optical disks, substrates for photomasks, ceramic substrates, and substrates for solar cells.

2. Description of Related Art

In semiconductor device or liquid crystal display device manufacturing processes, substrate processing apparatuses of a single substrate processing type, in which a single substrate is processed at a time, for example, include, in a processing chamber defined by a partition wall, a spin chuck arranged to rotate a substrate while holding the substrate thereon approximately horizontally, a processing liquid nozzle arranged to discharge processing liquid therethrough toward a central portion of the upper surface of the substrate rotated by the spin chuck, and a processing cup surrounding the spin chuck.

A central axis nozzle inserted through the rotary shaft of the spin chuck is used to supply processing liquid not only onto the upper surface but also onto the lower surface of the substrate held on the spin chuck. A discharge port is opened at the upper end of the central axis nozzle and opposed to the central portion of the lower surface of the substrate held on the spin chuck.

In such apparatuses, processing liquid is supplied concurrently onto the upper surface and the lower surface of the substrate (upper/lower concurrent processing; refer to U.S. Patent Application No. 2012/090649 A1).

SUMMARY OF THE INVENTION

Specifically, while the substrate is rotated by the spin chuck, processing liquid is discharged through the processing liquid nozzle toward the central portion of the upper surface of the substrate and through the central axis nozzle toward the central portion of the lower surface of the substrate. The processing liquid supplied onto the upper surface of the substrate undergoes a centrifugal force due to the rotation of the substrate to spread on the upper surface of the substrate from the central portion toward a peripheral portion. This causes the processing liquid to reach the entire upper surface of the substrate. On the other hand, the processing liquid discharged upward through the discharge port of the central axis nozzle and landing in the central portion of the lower surface of the substrate undergoes a centrifugal force due to the rotation of the substrate to move on the lower surface of the substrate from the central portion toward the peripheral portion. This causes the processing liquid to reach the entire lower surface of the substrate. The processing liquid then splatters laterally from the peripheral portions of the upper surface and the lower surface of the substrate. The processing liquid splattering from the peripheral portions of the substrate is received by the processing cup so as not to flow out of the processing cup (i.e., into the processing chamber).

In such upper/lower concurrent processing, a film of processing liquid is maintained on each of the upper surface and the lower surface of the substrate. For uniform processing of the entire front and back surfaces of the substrate with the processing liquid and protection of the substrate from re-adherence and/or impingement of the processing liquid to the substrate, it is necessary to cover the entire upper surface of the substrate with the film of processing liquid and to cover the entire lower surface of the substrate with the film of processing liquid. In such upper/lower concurrent processing, it is also necessary for the substrate to be rotated at a predetermined high speed to prevent the processing liquid moving on the lower surface of the substrate from falling off.

However, performing such upper/lower concurrent processing on the substrate while rotating the substrate at high speed suffers from the following problems.

That is, during the upper/lower concurrent processing on the substrate, the processing liquid may not splatter laterally but splash obliquely upward from the peripheral portions of the substrate. This is believed to be due to the possibility that the processing liquid running on the lower surface of the substrate and reaching the peripheral portion of the substrate splatters obliquely upward along the oblique surface of the chuck pin of the spin chuck. When the substrate is rotated at high speed, a large centrifugal force acts on the processing liquid, which may result in an increase in the amount of splashing of the processing liquid.

A large obliquely upward splash of the processing liquid from the peripheral portions of the substrate may flow out of the processing cup (into the processing chamber). The processing liquid flowing out of the processing cup may adhere to the upper and lower surfaces of the substrate in a step of drying the substrate to result in contamination of the upper and lower surfaces of the substrate.

In addition, the processing liquid splattering from the peripheral portions of the substrate will impinge on the processing cup but, if the processing liquid splatters obliquely upward from the peripheral portions of the substrate depending on the attitude of the inner wall of the processing cup, the processing liquid impinging on the inner wall of the processing cup may splash toward the substrate. In this case, droplets of the processing liquid may fall on the upper surface of the substrate to result in contamination of the substrate.

It may be possible to set the rotational speed of the substrate slightly low to prevent the processing liquid from flowing out of the processing cup and splashing toward the substrate. Setting the rotational speed of the substrate low, however, may result in that the entire upper surface of the substrate cannot be covered with the processing liquid. Increasing the flow rate of the processing liquid supplied onto the substrate allows the entire upper surface of the substrate to be covered with the processing liquid even if the substrate may have a somewhat lower rotational speed but, in this case, the processing liquid would be required at a larger amount of consumption per one substrate processing, which would accordingly result in an increase in processing cost.

An object of the present invention is thus to provide a substrate processing method and a substrate processing apparatus for high-quality substrate processing with a reduced amount of processing liquid consumption.

The present invention provides a substrate processing method to be implemented in a substrate processing apparatus including a substrate holding and rotating unit having a spin base rotatable about a predetermined vertical axis and multiple substrate support members provided in a manner rotatable together with the spin base and arranged to come into contact with the peripheral end edge of the substrate to support the substrate thereon, the substrate holding and rotating unit arranged to rotate the substrate about the vertical axis while holding the substrate horizontally, and a processing cup surrounding the substrate holding and rotating unit and arranged to receive processing liquid splattering from the substrate rotated by the substrate holding and rotating unit, the substrate processing method including a substrate rotating step of rotating the spin base to rotate the substrate about the vertical axis at a predetermined liquid processing speed and, in parallel with the substrate rotating step, a processing liquid supplying step of supplying processing liquid onto the lower surface of the substrate at a predetermined first flow rate and supplying processing liquid onto the upper surface of the substrate at a second flow rate that is higher than the first flow rate.

In accordance with the method above, the processing liquid moving on the lower surface of the substrate and reaching the peripheral portion comes into contact with the rotating substrate support members to splatter mainly obliquely upward and outward. The processing liquid moving on the upper surface of the substrate and reaching the peripheral portion comes into contact with the rotating substrate support members to splatter mainly obliquely downward and outward. In the peripheral portion of the substrate, the flow of the processing liquid moving on the lower surface of the substrate and splattering from the peripheral portion of the lower surface of the substrate (hereinafter referred to as "processing liquid splattering from the peripheral portion of the lower surface of the substrate") and the flow of the processing liquid moving on the upper surface of the substrate and splattering from the peripheral portion of the upper surface of the substrate (hereinafter referred to as "processing liquid splattering from the peripheral portion of the upper surface of the substrate") intersect vertically. As a result, the processing liquid splattering from the peripheral portion of the lower surface of the substrate and the processing liquid splattering from the peripheral portion of the upper surface of the substrate interfere with each other in the peripheral portion of the substrate.

Since the flow rate of the processing liquid supplied onto the upper surface of the substrate is higher than the flow rate of the processing liquid supplied onto the lower surface of the substrate, the processing liquid splattering from the peripheral portion of the upper surface of the substrate limits the splattering direction of the processing liquid splattering from the peripheral portion of the lower surface of the substrate. That is, it is possible to force down the general splattering direction of the processing liquid splattering from the peripheral portions of the substrate. As a result, the processing liquid splattering from the peripheral portions of the substrate is received by the processing cup, and it is thus possible to suppress or prevent the processing liquid from flowing out of the processing cup. It is therefore possible to suppress or prevent contamination of the substrate due to adherence of droplets of the processing liquid to the substrate.

In addition, since the general splattering direction of the processing liquid splattering from the peripheral portions of the substrate is thus forced down, it is possible to suppress droplets of the processing liquid from splashing toward the substrate due to impingement on the processing cup. It is therefore possible to suppress or prevent contamination of the substrate due to adherence of droplets of the processing liquid to the substrate.

As described heretofore, high-quality substrate processing can be achieved with a reduced amount of processing liquid consumption.

The liquid processing speed and the second flow rate may be set such that the entire lower surface of the substrate can be covered with a film of processing liquid. If the rotational speed of the substrate is equal to or higher than 500 rpm, the processing liquid can be maintained on the lower surface of the substrate, although depending on the flow rate of the processing liquid supplied onto the lower surface of the substrate.

The first flow rate may be 1.0 (liter/minute) or higher. In accordance with the method, since the first flow rate is 1.0 (liter/minute) or higher, the film of processing liquid covering the entire lower surface of the substrate can be maintained on the lower surface of the substrate.

The flow rate ratio of the second flow rate to the first flow rate may be 1.5 or higher. In accordance with the method, if the flow rate ratio of the second flow rate to the first flow rate is 1.5 or higher, the processing liquid splattering from the peripheral portion of the upper surface of the substrate can force down the splattering direction of the processing liquid splattering from the peripheral portion of the lower surface of the substrate, whereby it is possible to reliably force down the general splattering direction of the processing liquid splattering from the peripheral portions of the substrate.

The liquid processing speed may be equal to or higher than 800 rpm but equal to or lower than 1200 rpm. In accordance with the method, the processing liquid covering the entire lower surface of the substrate can be maintained on the lower surface and it is also possible to suppress the processing liquid from flowing out of the processing cup and splashing toward the substrate. If the rotational speed of the substrate is lower than 800 rpm, the entire upper surface of the substrate cannot be covered with the film of processing liquid. On the other hand, if the rotational speed of the substrate is higher than 1200 rpm, the processing liquid may flow out of the processing cup and splash toward the substrate in an increased amount.

The present invention provides a substrate processing apparatus including a substrate holding and rotating unit having a spin base rotatable about a predetermined vertical axis and multiple substrate support members provided in a manner rotatable together with the spin base and arranged to come into contact with the peripheral end edge of the substrate to support the substrate thereon, the substrate holding and rotating unit arranged to rotate the substrate about the vertical axis while holding the substrate horizontally, an upper processing liquid supplying unit arranged to supply processing liquid onto the upper surface of the substrate, a lower processing liquid supplying unit arranged to supply processing liquid onto the lower surface of the substrate, and a control unit arranged to control the substrate holding and rotating unit, the upper processing liquid supplying unit, and the lower processing liquid supplying unit, in which the control unit is arranged to perform a substrate rotating step of rotating the spin base about the vertical axis at a predetermined liquid processing speed and, in parallel with the substrate rotating step, a processing liquid supplying step of supplying processing liquid onto the lower surface of the substrate at a predetermined first flow rate and supplying processing liquid onto the upper surface of the substrate at a second flow rate that is higher than the first flow rate.

In accordance with the arrangement above, the processing liquid moving on the lower surface of the substrate and reaching the peripheral portion comes into contact with the rotating substrate support members to splatter mainly obliquely upward and outward. The processing liquid moving on the upper surface of the substrate and reaching the peripheral portion comes into contact with the rotating substrate support members to splatter mainly obliquely downward and outward. The flow of the processing liquid splattering from the peripheral portion of the lower surface of the substrate and the flow of the processing liquid splattering from the peripheral portion of the upper surface of the substrate intersect vertically. As a result, the processing liquid splattering from the peripheral portion of the lower surface of the substrate and the processing liquid splattering from the peripheral portion of the upper surface of the substrate interfere with each other in the peripheral portion of the substrate.

Since the flow rate of the processing liquid supplied onto the upper surface of the substrate is higher than the flow rate of the processing liquid supplied onto the lower surface of the substrate, the processing liquid splattering from the peripheral portion of the upper surface of the substrate limits the splattering direction of the processing liquid splattering from the peripheral portion of the lower surface of the substrate. That is, it is possible to force down the general splattering direction of the processing liquid splattering from the peripheral portions of the substrate. As a result, the processing liquid splattering from the peripheral portions of the substrate is received by the processing cup, and it is thus possible to suppress or prevent the processing liquid from flowing out of the processing cup. It is therefore possible to suppress or prevent contamination of the substrate due to adherence of droplets of the processing liquid to the substrate.

In addition, since the general splattering direction of the processing liquid splattering from the peripheral portions of the substrate is thus forced down, it is possible to suppress droplets of the processing liquid from splashing toward the substrate due to impingement on the processing cup. It is therefore possible to suppress or prevent contamination of the substrate due to adherence of droplets of the processing liquid to the substrate.

As described heretofore, high-quality substrate processing can be achieved with a reduced amount of processing liquid consumption.

The substrate support members may each have a clamping portion defined by a first contact surface to be in contact with the peripheral edge of the lower surface of the substrate and a second contact surface to be in contact with the peripheral edge of the upper surface of the substrate. In this case, the first contact surface may be inclined upward toward the outside in the rotational radial direction of the substrate with respect to the horizontal plane, and the second contact surface may be inclined downward toward the outside in the rotational radial direction of the substrate with respect to the horizontal plane.

In accordance with the arrangement above, the splattering direction of the processing liquid moving on the lower surface of the substrate and coming into contact with each substrate support member to splatter approximately follows an extended surface of the first contact surface of the substrate support member. That is, the splattering direction of the processing liquid splattering from the peripheral portion of the lower surface of the substrate is inclined upward toward the outside in the radial direction with respect to the horizontal plane.

On the other hand, the splattering direction of the processing liquid moving on the upper surface of the substrate and coming into contact with each substrate support member to splatter approximately follows an extended surface of the second contact surface of the substrate support member. That is, the splattering direction of the processing liquid splattering from the peripheral portion of the upper surface of the substrate is inclined downward toward the outside in the radial direction with respect to the horizontal plane.

In the peripheral portion of the substrate, the flow of the processing liquid splattering from the peripheral portion of the lower surface of the substrate and the flow of the processing liquid splattering from the peripheral portion of the upper surface of the substrate intersect vertically. As a result, the processing liquid splattering from the peripheral portion of the lower surface of the substrate and the processing liquid splattering from the peripheral portion of the upper surface of the substrate interfere with each other in the peripheral portion of the substrate. Since the flow rate of the processing liquid supplied onto the upper surface of the substrate is higher than the flow rate of the processing liquid supplied onto the lower surface of the substrate, the processing liquid splattering from the peripheral portion of the upper surface of the substrate limits the splattering direction of the processing liquid splattering from the peripheral portion of the lower surface of the substrate, resulting in that it is possible to force down the general splattering direction of the processing liquid splattering from the peripheral portions of the substrate.

The substrate processing apparatus may further include a setting unit arranged to set the liquid processing speed and the second flow rate such that the entire lower surface of the substrate can be covered with a film of processing liquid.

The aforementioned or other objects, features, and advantageous effects of the present invention will be clarified by the following description of preferred embodiments given below with reference to the accompanying drawings.

BRIEF DESCRIPTION OF THE DRAWINGS

FIG. 6 is a side view showing the condition of the substrate in the chemical solution step.

FIG. 7 is a side view showing the condition of the substrate in the rinsing step.

FIG. 17 shows results of a seventh test.

DETAILED DESCRIPTION OF PREFERRED EMBODIMENTS

Figure 1:
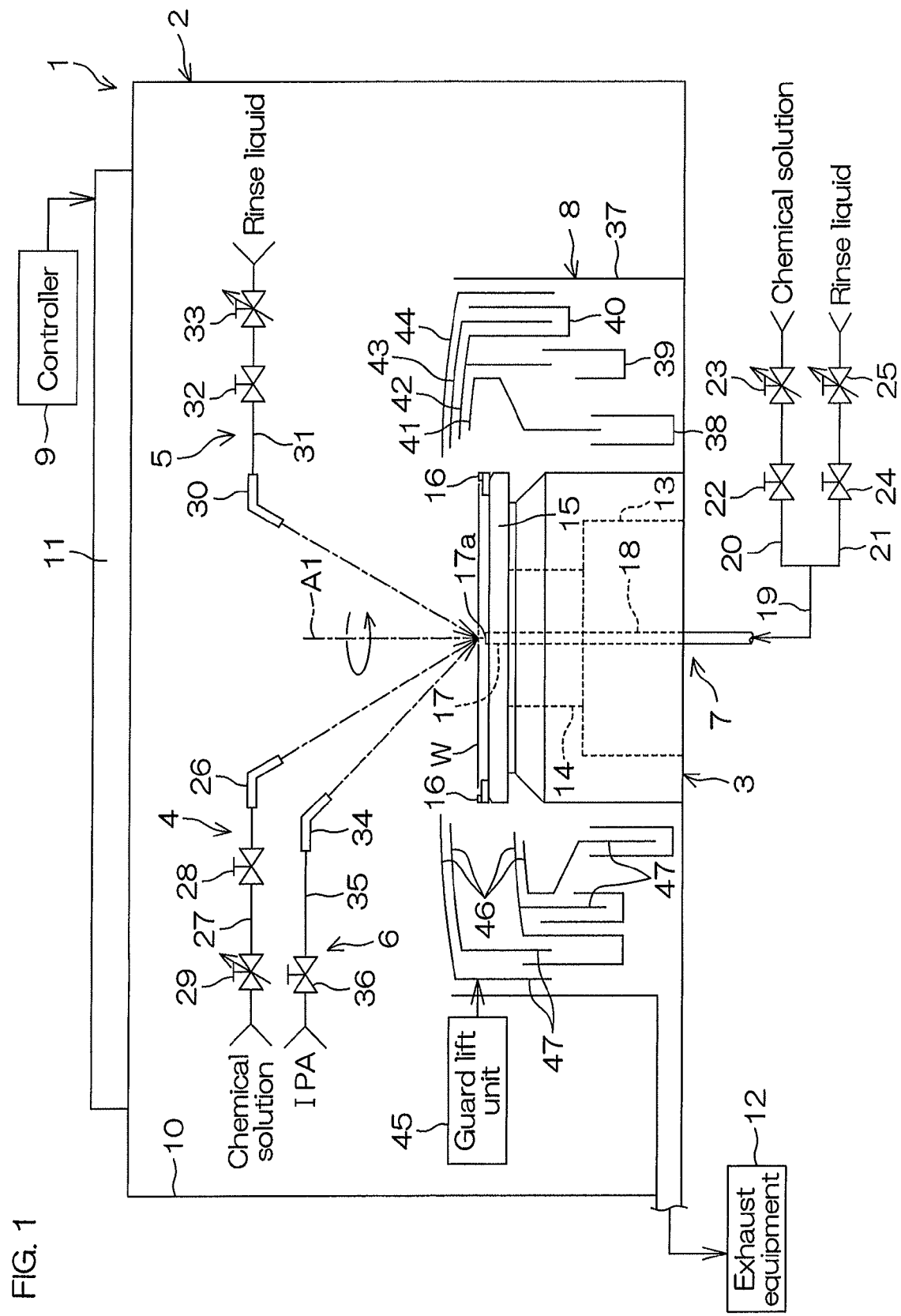
FIG. 1 schematically shows the configuration of a substrate processing apparatus according to a preferred embodiment of the present invention.

FIG. 1 schematically shows the configuration of a substrate processing apparatus 1 according to a preferred embodiment of the present invention.

The substrate processing apparatus 1 is a single substrate processing type one in which liquid processing such as cleaning processing and etching processing is performed on the front surface, a device formation area, and the back surface of a circular substrate W such as a semiconductor wafer.

The substrate processing apparatus 1 includes, in a processing chamber 2, a spin chuck (substrate holding and rotating unit) 3 arranged to hold and rotate the substrate W, a chemical solution supplying unit (upper processing liquid supplying unit) 4 arranged to supply chemical solution onto the front surface (upper surface) of the substrate W held on the spin chuck 3, a rinse liquid supplying unit (upper processing liquid supplying unit) 5 arranged to supply DIW (deionized water) as an example of rinse liquid onto the front surface (upper surface) of the substrate W held on the spin chuck 3, an organic solvent supplying unit 6 arranged to supply isopropyl alcohol (IPA) liquid as an example of organic solvent with low surface tension, a lower surface processing liquid supplying unit (lower processing liquid supplying unit) 7 arranged to supply processing liquid (chemical solution or water) onto the back surface (lower surface) of the substrate W held on the spin chuck 3, a cylindrical processing cup 8 surrounding the spin chuck 3, and a controller (control unit, setting unit) 9 arranged to control the operation of the equipment included in the substrate processing apparatus 1 and the opening/closing of valves.

The processing chamber 2 includes a box-shaped partition wall 10, an FFU (fan filter unit) 11 serving as a blower unit arranged to feed cleaned air from above the partition wall 10 to the inside of the partition wall 10 (corresponding to the inside of the processing chamber 2), and exhaust equipment 12 arranged to discharge gas in the processing chamber 2 through a lower portion of the partition wall 10. The spin chuck 3, a chemical solution nozzle 26 of the chemical solution supplying unit 4, a rinse liquid nozzle 30 of the rinse liquid supplying unit 5, and an organic solvent nozzle 34 of the organic solvent supplying unit 6 are housed and arranged within the partition wall 10.

The FFU 11 is located over the partition wall 10 and attached to the ceiling of the partition wall 10. The FFU 11 is arranged to feed cleaned air through the ceiling of the partition wall 10 into the processing chamber 2. The exhaust equipment 12 is connected to a bottom portion of the processing cup 8 for suction inside the processing cup 8 through the bottom portion of the processing cup 8. The FFU 11 and the exhaust equipment 12 can form a downflow in the processing chamber 2.

The spin chuck 3 employs a clamping type one arranged to horizontally hold the substrate W to keep the substrate W horizontal. Specifically, the spin chuck 3 includes a spin motor 13, a spin shaft 14 integrated with the drive shaft of the spin motor 13, a disk-shaped spin base 15 attached approximately horizontally to the upper end of the spin shaft 14, and multiple (three or more; six, for example) clamping members (substrate support members) 16 disposed on the spin base 15. The multiple clamping members 16 are disposed in a peripheral portion of the upper surface of the spin base 15 in an appropriately spaced manner on the circle corresponding to the outer peripheral contour of the substrate W.

The multiple clamping members 16 clamps the substrate W horizontally in cooperation with each other. In this state, when the spin motor 13 is driven, the driving force causes the spin base 15 to be rotated about a predetermined rotational axis (vertical axis) A1 and, together with the spin base 15, the substrate W to be rotated about the rotational axis A1 is kept approximately horizontal.

The chemical solution supplying unit 4 includes the chemical solution nozzle 26. The chemical solution nozzle 26 is, for example, a straight nozzle arranged to discharge liquid in a state of continuous flow therethrough and located fixedly over the spin chuck 3 with its discharge port directed toward a central portion of the upper surface of the substrate W. The chemical solution nozzle 26 is connected with a chemical solution supply pipe 27 through which chemical solution is supplied from a chemical solution supply source. In an intermediate portion of the chemical solution supply pipe 27, a chemical solution valve 28 arranged to switch between supply/stop of chemical solution through the chemical solution nozzle 26 and a chemical solution flow rate control valve 29 arranged to adjust the degree of opening of the chemical solution supply pipe 27 to control the flow rate of chemical solution to be discharged through the chemical solution nozzle 26 are provided in this order from the chemical solution nozzle 26. Examples of chemical solution to be supplied through the chemical solution supply pipe 27 include diluted hydrofluoric acid (DHF), concentrated hydrofluoric acid (concHF), fluonitric acid (hydrofluoric acid-nitric acid ($HNO_3$) mixture), and ammonium fluoride. The chemical solution flow rate control valve 29 includes a valve body with a valve seat provided therein, a valve element arranged to open/close the valve seat, and an actuator arranged to move the valve element between an opening position and a closing position, although not shown. The same applies to the other flow rate control valves.

The rinse liquid supplying unit 5 includes the rinse liquid nozzle 30. The rinse liquid nozzle 30 is, for example, a straight nozzle arranged to discharge liquid in a state of continuous flow therethrough and located fixedly over the spin chuck 3 with its discharge port directed toward the central portion of the upper surface of the substrate W. The rinse liquid nozzle 30 is connected with a rinse liquid supply pipe 31 through which rinse liquid is supplied from a rinse liquid supply source. In an intermediate portion of the rinse liquid supply pipe 31, a rinse liquid valve 32 arranged to switch between supply/stop of rinse liquid through the rinse liquid nozzle 30 and a rinse liquid flow rate control valve 33 arranged to adjust the degree of opening of the rinse liquid supply pipe 31 to control the flow rate of water to be discharged through the rinse liquid nozzle 30 are provided in this order from the rinse liquid nozzle 30. Examples of rinse liquid to be supplied through the rinse liquid supply pipe 31 include DIW (deionized water), carbonated water, electrolyzed ionic water, ozone water, hydrochloric acid water with a dilute concentration (of about 10 to 100 ppm, for example), regenerated water (hydrogen water), and degassed water.

The organic solvent supplying unit 6 includes the organic solvent nozzle 34. The organic solvent nozzle 34 is, for example, a straight nozzle arranged to discharge liquid in a state of continuous flow therethrough and located fixedly over the spin chuck 3 with its discharge port directed toward the central portion of the upper surface of the substrate W.

The organic liquid nozzle 30 is connected with an organic solvent supply pipe 35 through which IPA liquid is supplied from an IPA supply source. In an intermediate portion of the organic solvent supply pipe 35, an organic solvent valve 36 arranged to switch between supply/stop of IPA through the organic solvent nozzle 34 is provided.

In addition, the chemical solution nozzle 26, the rinse liquid nozzle 30, and the organic solvent nozzle 34 may not necessarily be located fixedly with respect to the spin chuck 3, but may employ, for example, a so-called scan nozzle form in which the nozzles are each attached to an arm swingable horizontally over the spin chuck 3 and the landing position of processing liquid (chemical solution, rinse liquid, or organic solvent) on the upper surface of the substrate W is scanned by swinging the arm.

The lower processing liquid supplying unit 7 includes a lower surface nozzle (central axis nozzle) 17, a first processing liquid supply pipe 18 extending vertically in the spin shaft 14, and a second processing liquid supply pipe 19 connected to the first processing liquid supply pipe 18. The second processing liquid supply pipe 19 is connected with a lower chemical solution supply pipe 20. At the upper end of the lower surface nozzle 17, a discharge port 17a is defined opposed to the central portion of the lower surface (back surface) of the substrate W held on the spin chuck 3. In the lower chemical solution supply pipe 20, a lower chemical solution valve 22 arranged to open/close the lower chemical solution supply pipe 20 and a lower chemical solution flow rate control valve 23 arranged to adjust the degree of opening of the lower chemical solution supply pipe 20 are provided in this order from the second processing liquid supply pipe 19. The second processing liquid supply pipe 19 is connected with a lower rinse liquid supply pipe 21. In the lower rinse liquid supply pipe 21, a lower rinse liquid valve 24 arranged to open/close the lower rinse liquid supply pipe 21 and a lower rinse liquid flow rate control valve 25 arranged to adjust the degree of opening of the lower rinse liquid supply pipe 21 are provided in this order from the second processing liquid supply pipe 19.

When the lower chemical solution valve 22 is opened with the lower rinse liquid valve 24 closed, chemical solution is supplied via the second processing liquid supply pipe 19 and the first processing liquid supply pipe 18 to the lower surface nozzle 17. The chemical solution supplied to the lower surface nozzle 17 is then discharged upward through the discharge port 17a. The chemical solution is thus supplied onto the central portion of the lower surface of the substrate W held on the spin chuck 3. The flow rate of chemical solution to be discharged through the lower surface nozzle 17 is to be controlled by the lower chemical solution flow rate control valve 23.

Similarly, when the lower rinse liquid valve 24 is opened with the lower chemical solution valve 22 closed, rinse liquid is supplied via the second processing liquid supply pipe 19 and the first processing liquid supply pipe 18 to the lower surface nozzle 17. The rinse liquid supplied to the lower surface nozzle 17 is then discharged upward through the discharge port 17a. The rinse liquid is thus supplied onto the central portion of the lower surface of the substrate W held on the spin chuck 3. The flow rate of water to be discharged through the lower surface nozzle 17 is to be controlled by the lower rinse liquid flow rate control valve 25.

The processing cup 8 is disposed externally to the substrate W held on the spin chuck 3 (away from the rotational axis A1). The processing cup 8 includes a cylindrical member 37 surrounding the spin chuck 3, multiple cups 38 to 40 (first to third cups 38 to 40) disposed between the spin chuck 3 and the cylindrical member 37, multiple guards 41 to 44 (first to fourth guards 41 to 44) arranged to receive processing liquid (chemical solution, rinse liquid, or organic solvent) splattering around the substrate W, and a guard lift unit 45 arranged to individually raise/lower the multiple guards 41 to 44. The processing cup 8 is disposed externally to the outer periphery of the substrate W held on the spin chuck 3 (away from the rotational axis A1). In FIG. 1, the processing cup 8 is shown to be in different states on the right side and the left side of the rotational axis A1.

The cups 38 to 40 are cylindrical and surround the spin chuck 3 between the spin chuck 3 and the cylindrical member 37. The second (second inner) cup 39 is disposed externally to the first cup 38, and the third cup 40 is disposed externally to the second cup 39. The third cup 40 is integrated with, for example, the second guard 42 to be raised/lowered together with the second guard 42. The cups 38 to 40 each define an annular groove opened upward. The grooves of the cups 38 to 40 are each connected with a recovery pipe (not shown) or a waste liquid pipe (not shown). Processing liquid guided to the bottom of each of the cups 38 to 40 is sent to a recovery unit (not shown) or a waste liquid unit (not shown) through the recovery pipe or the waste liquid pipe. The processing liquid discharged from the substrate W is thus recovered or discarded.

The guards 41 to 44 are cylindrical and surround the spin chuck 3 between the spin chuck 3 and the cylindrical member 37. The guards 41 to 44 each include a cylindrical guide portion 47 surrounding the spin chuck 3 and a cylindrical inclined portion 46 extending obliquely upward from the upper end of the guide portion 47 toward the center (toward the rotational axis A1 of the substrate W). The upper end portion of each inclined portion 46 forms an inner peripheral portion of each of the guards 41 to 44, having a diameter greater than those of the substrate W and the spin base 15. The four inclined portions 46 overlap each other and the four guide portions 47 are disposed coaxially. The three guide portions 47 (of the guards 41 to 43) excluding the guide portion 47 of the outermost fourth guard 44 can be inserted/retracted, respectively, into/from the multiple cups 38 to 40. That is, the processing cup 8 is foldable so as to be expanded and folded when the guard lift unit 45 raises/lowers at least one of the four guards 41 to 44. In addition, the inclined portions 46 may extend in an upward convex smooth arc in a cross-section as shown in FIG. 1 or may extend linearly, for example.

The substrate W is supplied with processing liquid (chemical solution, rinse liquid, or organic solvent) and dried with any one of the guards 41 to 44 opposed to the peripheral end face of the substrate W. For example, when the third (third inner) guard 43 is opposed to the peripheral end face of the substrate W, the first guard 41 and the second guard 42 are each located at a lower position (as shown on the left side in FIG. 1), while the third guard 43 and the fourth guard 44 are each located at a higher position (as shown on the left side in FIG. 1). When the first (innermost) guard 41 is opposed to the peripheral end face of the substrate W, all of the four guards 41 to 44 are each located at a higher position (as shown on the right side in FIG. 1).

For example, a chemical solution step (S3 in FIG. 3), a rinsing step (S4 in FIG. 3), and an IPA replacing step (S5 in FIG. 3) to be described hereinafter are performed with any one of the three guards 41 to 43 excluding the fourth (outermost) guard 44 opposed to the peripheral end face of the substrate W. Accordingly, processing liquid supplied onto the substrate W and splattering around the substrate W is guided by one of the first guard 41, the second guard 42, and the third guard 43 into the corresponding one of the cups 38 to 40.

Figure 2:
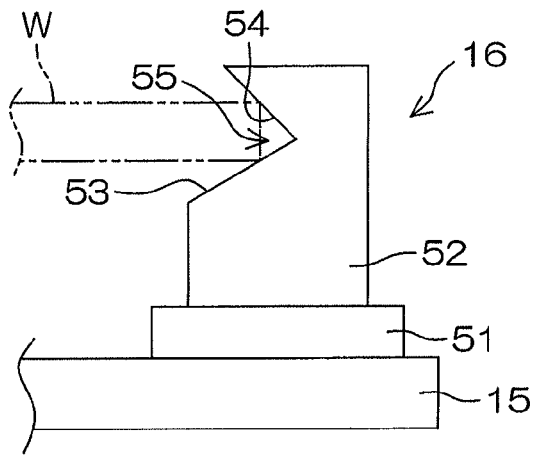
FIG. 2 is a side view of the clamping member shown in FIG. 1.

FIG. 2 is a side view of each of the clamping members 16. The clamping member 16 includes a base 51 disposed in the peripheral portion of the spin base 15 and a columnar clamping portion 52 fixed to the upper surface of the base 51. In the outer peripheral surface of the clamping portion 52, a clamping groove 55 is defined opened horizontally inward (toward the rotational axis A1) in a V shape and arranged to clamp the peripheral end face of the substrate. The clamping groove 55 is defined by a lower contact surface (first contact surface) 53 inclined upward toward the outside in the rotational radial direction of the substrate W with respect to the horizontal plane and an upper contact surface (second contact surface) 54 inclined downward toward the outside in the rotational radial direction of the substrate W with respect to the horizontal plane. The lower contact surface 53 is inclined by an angle θ1 with respect to the horizontal plane (see FIG. 8) and the upper contact surface 54 is inclined by an angle θ2 with respect to the horizontal plane (see FIG. 8). When the peripheral end edge of the substrate W is clamped in the clamping groove 55, the end edge of the lower surface of the substrate W is in contact with the lower contact surface 53 and the end edge of the upper surface of the substrate W is in contact with the upper contact surface 54.

Figure 3:
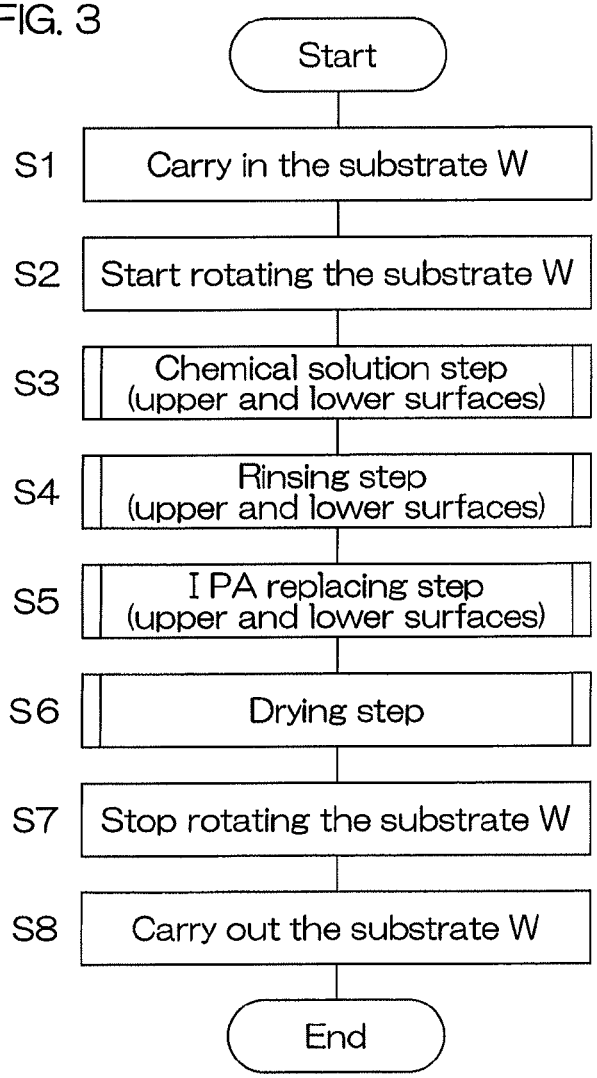
FIG. 3 is a process chart illustrating an example of etching processing to be performed in the substrate processing apparatus shown in FIG. 1.
Figure 4:
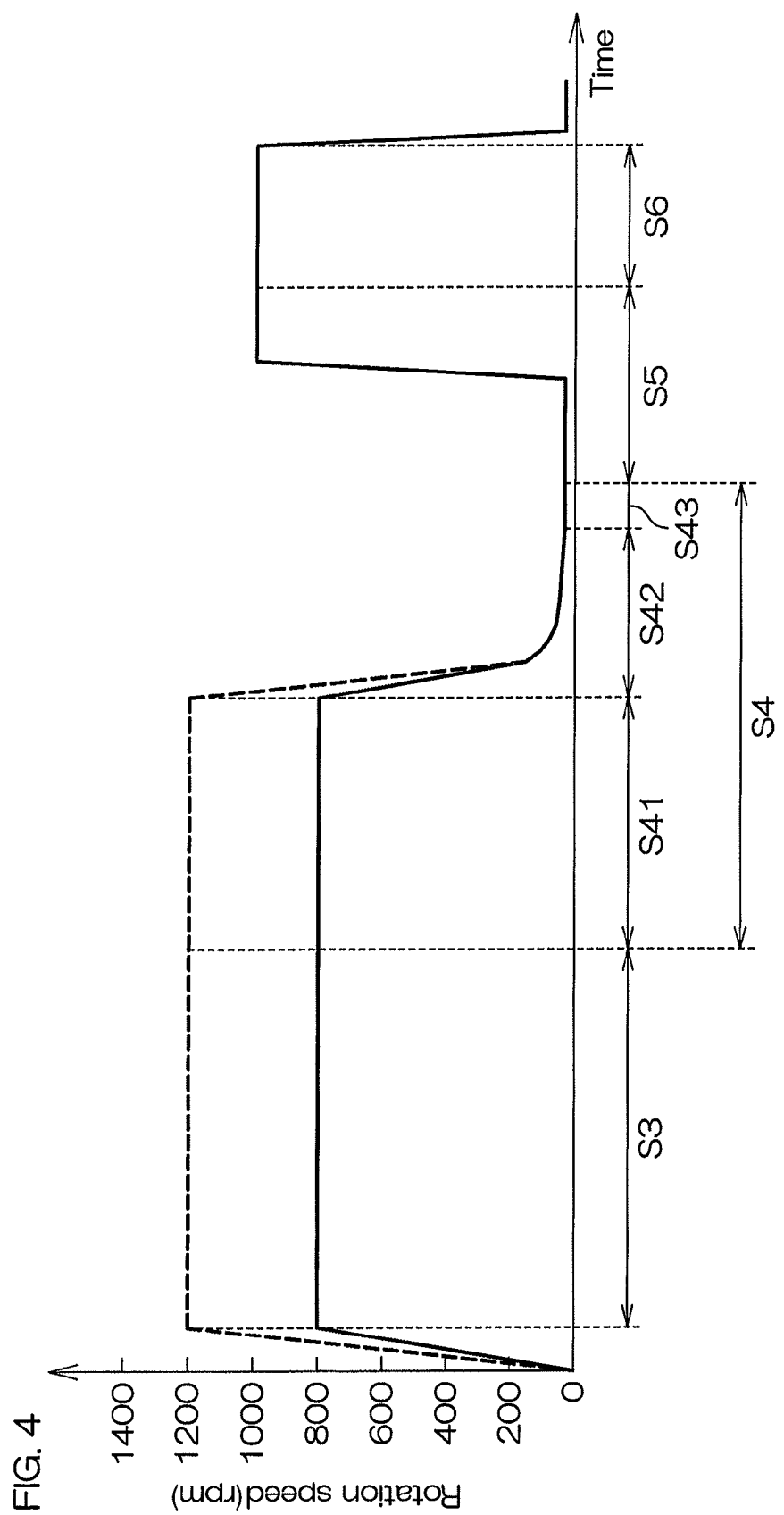
FIG. 4 shows a change in the rotational speed of the substrate in the steps included in the example of processing in FIG. 3.
Figure 5A:
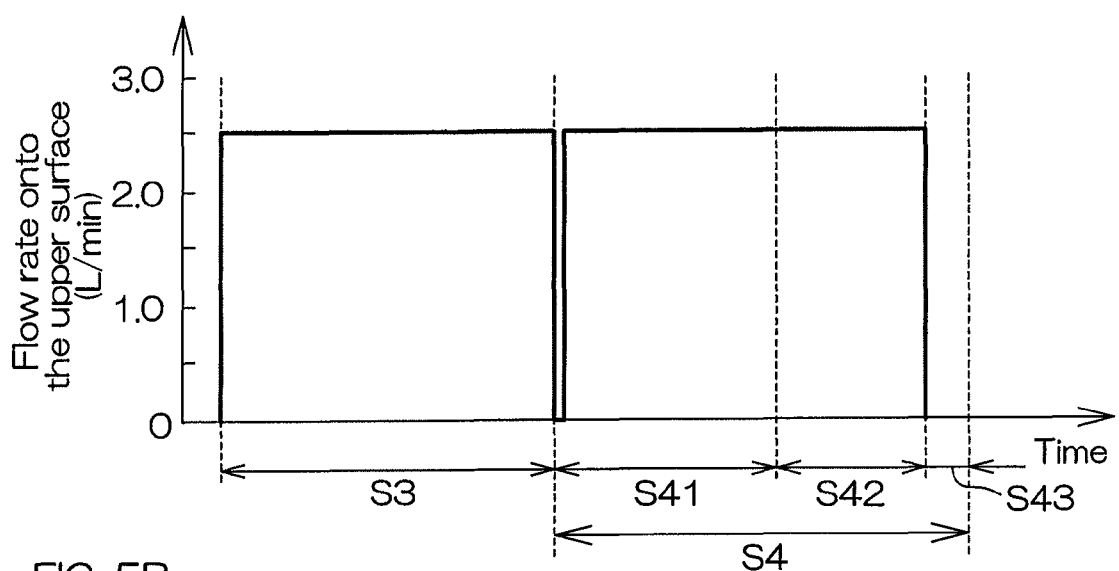
FIGS. 5A to 5C show the flow rate of processing liquid supply in the chemical solution step and the rinsing step.
Figure 5B:
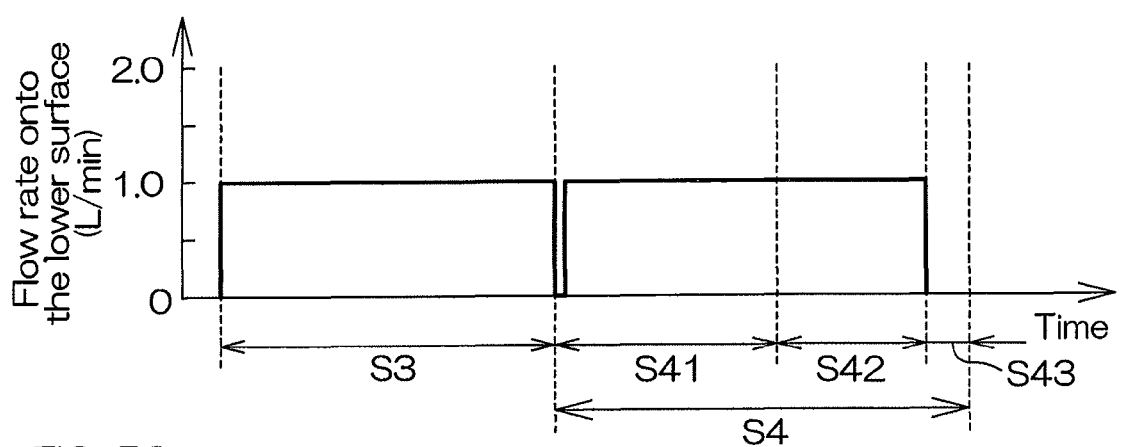
Figure 5C:
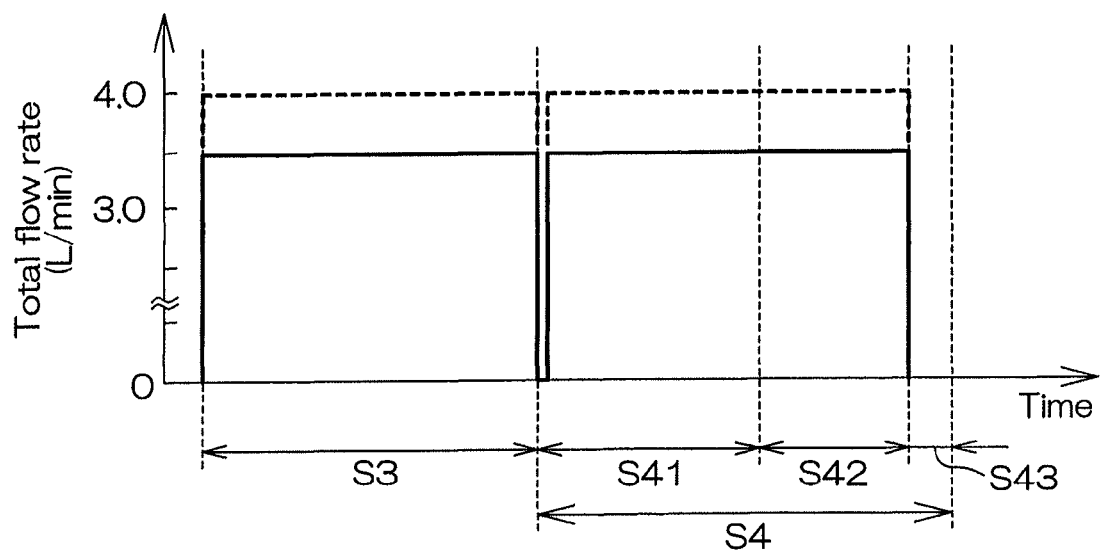
Figure 8:
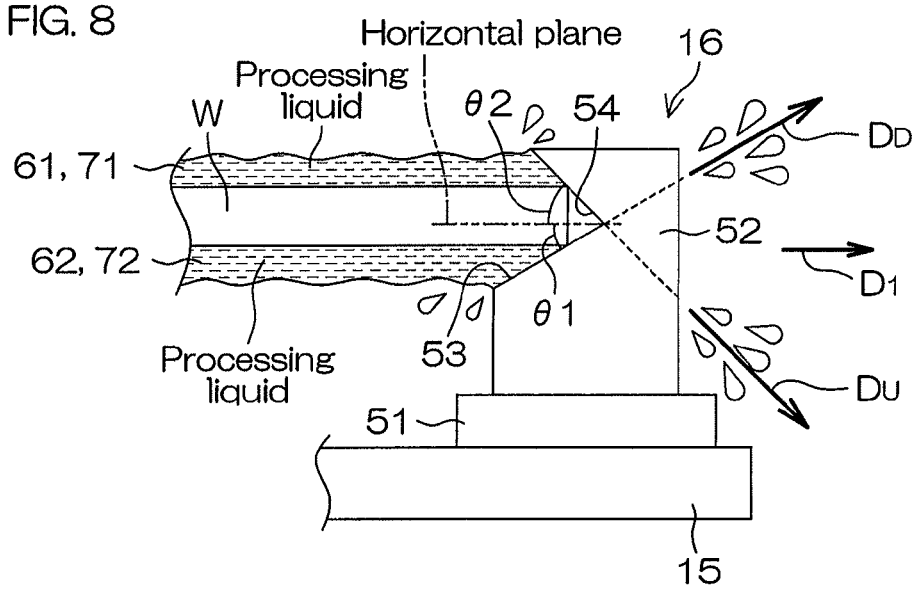
FIG. 8 shows the state in the vicinity of the clamping member in the chemical solution step and the rinsing step.

FIG. 3 is a process chart illustrating an example of etching processing to be performed in the substrate processing apparatus 1. FIG. 4 shows a change in the rotational speed of the substrate W in the steps included in the example of processing in FIG. 3. FIGS. 5A to 5C show the flow rate of processing liquid supply in the chemical solution step (S3) and the rinsing step (S4). FIG. 5A shows the flow rate of processing liquid supply onto the upper surface of the substrate W, while FIG. 5B shows the flow rate of processing liquid supply onto the lower surface of the substrate W. FIG. 5C shows the total flow rate of processing liquid supply onto the upper and lower surfaces of the substrate W. FIG. 6 is a side view showing the condition of the substrate W in the chemical solution step (S3). FIG. 7 is a side view showing the condition of the substrate W in the rinsing step (S4). FIG. 8 shows the state in the vicinity of the clamping member 16 in the chemical solution step (S3) and the rinsing step (S4).

An example of etching processing will hereinafter be described with reference to FIGS. 1, 3, and 4. Reference will also be made appropriately to FIGS. 5A to 8.

Upon etching processing, a delivery robot (not shown) is controlled to carry an unprocessed substrate W into the processing chamber 2 (see FIG. 1) (step S1). The substrate W is then transferred to the spin chuck 3 with the front surface facing upward. In addition, before the carry-in of the substrate W, the first to fourth guards 41 to 44 each have been lowered to a lower position (lowest position) so as not to get in the carry-in way, so that the upper ends of all the first to fourth guards 41 to 44 each have been located at a position lower than the position at which the substrate W is held on the spin chuck 3. A silicon wafer (bare silicon) with an oxide film formed on a surface thereof (in which a device is to be formed) may be used as an example of the substrate W. The substrate W may be a large-sized substrate (circular substrate having an outside diameter of 300 (mm), for example).

When the substrate W is held on the spin chuck 3, the controller 9 controls the spin motor 13 to start rotating the substrate W (step S2). The rotational speed of the substrate W is increased to a predefined liquid processing speed (800 rpm as shown in FIG. 4, for example) and kept at the liquid processing speed.

The controller 9 also controls the guard lift unit 45 to raise each of the third and fourth guards 43 and 44 to a higher position (highest position) so that the third guard 43 is opposed to the peripheral end face of the substrate W while keeping the first and second guards 41 and 42 at the lower position (lowest position).

When the rotational speed of the substrate W reaches the liquid processing speed, the controller 9 then starts performing the chemical solution step (step S3). Specifically, the controller 9 opens the chemical solution valve 28 and opens the lower chemical solution valve 22. This causes chemical solution to be discharged through the chemical solution nozzle 26 toward the central portion of the upper surface of the substrate W and discharged upward through the discharge port 17a of the lower surface nozzle 17 toward the central portion of the lower surface of the substrate W.

In this case, the flow rate (second flow rate) of chemical solution supply through the chemical solution nozzle 26 is set at, for example, 2.5 (liters/minute) as shown in FIG. 5A by controlling the chemical solution flow rate control valve 29. Also, the flow rate (first flow rate) of chemical solution supply through the lower surface nozzle 17 is set at, for example, 1.0 (liter/minute) as shown in FIG. 5B by controlling the lower chemical solution flow rate control valve 23. In this case, the total flow rate of chemical solution supply onto the substrate W is 3.5 (liters/minute) as shown in FIG. 5C, and the flow rate ratio of the flow rate of chemical solution supply through the chemical solution nozzle 26 to the flow rate of chemical solution supply through the lower surface nozzle 17 is 2.5.

The chemical solution supplied onto the central portion of the upper surface of the substrate W undergoes a centrifugal force due to the rotation of the substrate W to flow on the upper surface of the substrate W toward the peripheral portion of the substrate W. This causes a chemical solution film 61 covering the entire upper surface of the substrate W to be maintained on the upper surface of the substrate W as shown in FIG. 6. Also, the chemical solution supplied onto the central portion of the lower surface of the substrate W undergoes a centrifugal force due to the rotation of the substrate W to flow on the lower surface of the substrate W toward the peripheral portion of the substrate W. This causes a chemical solution film 62 covering the entire lower surface of the substrate W to be maintained on the lower surface of the substrate W as shown in FIG. 6. The chemical solution films 61 and 62 cause the chemical solution to be supplied onto the entire upper surface and the entire lower surface of the substrate W, which in turn causes the entire upper and lower surfaces of the substrate W to be processed by the chemical solution. If diluted hydrofluoric acid, concentrated hydrofluoric acid, fluonitric acid, ammonium fluoride, or the like is used as the chemical solution, the upper surface of the substrate W begins to show hydrophobicity with the processing by the chemical solution. In the example of processing, even if the upper surface of the substrate W may show hydrophobicity, the chemical solution film 61 covering the entire upper surface of the substrate W can be maintained on the upper surface of the substrate W.

As shown in FIG. 8, the chemical solution flowing on the upper surface of the substrate W toward the peripheral portion comes into contact, in the peripheral portion of the substrate W, with the clamping member 16 rotating integrally with the spin base 15 and splatters laterally from the substrate W. Similarly, the chemical solution flowing on the lower surface of the substrate W toward the peripheral portion also comes into contact, in the peripheral portion of the substrate W, with the clamping member 16 rotating integrally with the spin base 15 and then splatters laterally from the substrate W. The chemical solution discharged through the peripheral portions of the substrate W thus comes into contact with the clamping member 16 to thereby undergo a change in the splattering direction.

The splattering direction of the chemical solution moving on the lower surface of the substrate W and coming into contact with the clamping member 16 to splatter approximately follows an extended surface of the lower contact surface 53 of the clamping member 16. That is, the splattering direction $D_D$ of the chemical solution moving on the lower surface of the substrate W and splattering from the peripheral portion of the lower surface of the substrate W (hereinafter referred to as "chemical solution splattering from the peripheral portion of the lower surface of the substrate W") is inclined upward by the angle θ1 toward the outside in the radial direction with respect to the horizontal plane. On the other hand, the splattering direction of the chemical solution moving on the upper surface of the substrate W and coming into contact with the clamping member 16 to splatter approximately follows an extended surface of the upper contact surface 54 of the clamping member 16. That is, the splattering direction $D_U$ of the chemical solution moving on the upper surface of the substrate W and splattering from the peripheral portion of the upper surface of the substrate W (hereinafter referred to as "chemical solution splattering from the peripheral portion of the upper surface of the substrate W") is inclined downward by the angle θ2 toward the outside in the radial direction with respect to the horizontal plane.

During the chemical solution step (S3), in the peripheral portion of the substrate W, the flow of the chemical solution splattering from the peripheral portion of the lower surface of the substrate W and the flow of the chemical solution splattering from the peripheral portion of the upper surface of the substrate W intersect vertically. As a result, the chemical solution splattering from the peripheral portion of the lower surface of the substrate W and the chemical solution splattering from the peripheral portion of the upper surface of the substrate W interfere with each other in the peripheral portion of the substrate W. In the peripheral portion of the substrate W, the chemical solution then splatters in the general splattering direction $D_1$ composed of the splattering direction $D_D$ of the chemical solution splattering from the peripheral portion of the lower surface of the substrate W and the splattering direction $D_U$ of the chemical solution splattering from the peripheral portion of the upper surface of the substrate W.

Figure 9A:
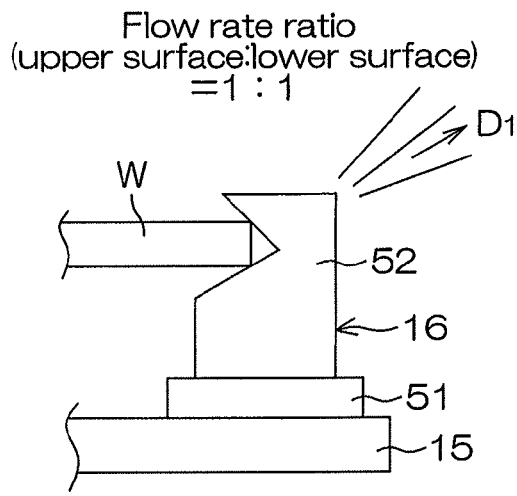
FIGS. 9A and 9B illustrate a change in the splattering direction of processing liquid from the peripheral portions of the substrate when the flow rate ratio of supply onto the upper and lower surfaces of the substrate is varied.

If the flow rate ratio of supply onto the upper and lower surfaces (upper surface:lower surface) were 1:1, the flow rate of the chemical solution splattering from the peripheral portion of the upper surface of the substrate W would not be higher than the flow rate of the chemical solution from the peripheral portion of the lower surface and, as shown in FIG. 9A, the chemical solution from the peripheral portion of the lower surface of the substrate W splattering obliquely upward could not be suppressed sufficiently, resulting in that the general splattering direction $D_1$ of the chemical solution would be inclined considerably upward toward the outside in the radial direction with respect to the horizontal plane.

Figure 9B:
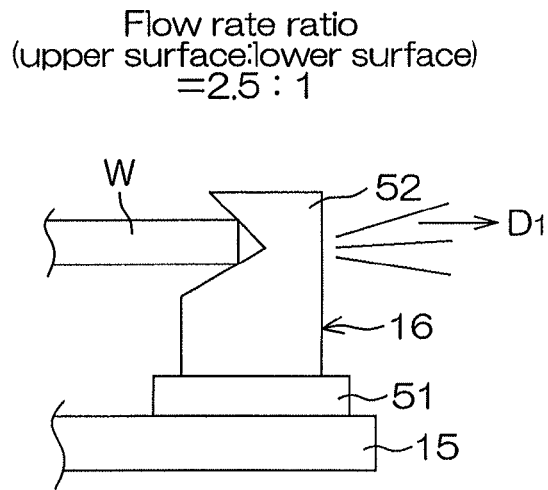

In contrast, since the flow rate ratio of supply onto the upper and lower surfaces (upper surface:lower surface) is 2.5:1 in the example of processing shown in FIG. 3, the flow rate of the chemical solution splattering from the peripheral portion of the upper surface of the substrate W is much higher than the flow rate of the chemical solution from the peripheral portion of the lower surface. As a result, the chemical solution splattering from the peripheral portion of the upper surface of the substrate W forces down the splattering direction of the chemical solution splattering from the peripheral portion of the lower surface of the substrate W, as shown in FIG. 9B, resulting in that the general splattering direction $D_1$ of the chemical solution approximately follows or becomes close to the horizontal direction with respect to the horizontal plane.

Accordingly, most of the chemical solution splattering from the peripheral portions of the substrate W is received by the inner wall of the third guard 43. It is therefore possible to suppress or prevent the chemical solution from flowing out of the processing cup 8 during the chemical solution step (S3). The chemical solution running down the inner wall of the guide portion 47 of the third guard 43 collects at the bottom of the third cup 40 and is guided to the recovery unit (not shown) through the recovery pipe (not shown).

When a predefined chemical solution processing time has elapsed since the start of the discharge of the chemical solution, the controller 9 closes the chemical solution valve 28 and the lower chemical solution valve 22 to stop the discharge of the chemical solution through the chemical solution nozzle 26 and the lower surface nozzle 17.

The controller 9 also controls the guard lift unit 45 to move each of the first and second guards 41 and 42 to the higher position (highest position) so that the first guard 41 is opposed to the peripheral end face of the substrate W. In this state, all of the first to fourth guards 41 to 44 are each located at the higher position.

When the first and second guards 41 and 42 are each located at the higher position, the controller 9 then starts performing the rinsing step (step S4). Specifically, following the chemical solution step (S3), the controller 9 opens the rinse liquid valve 32 and opens the lower rinse liquid valve 24 while keeping the rotational speed of the substrate W at the liquid processing speed. This causes rinse liquid to be discharged through the rinse liquid nozzle 30 toward the central portion of the upper surface of the substrate W and discharged upward through the discharge port 17a of the lower surface nozzle 17 toward the central portion of the lower surface of the substrate W.

In this case, the flow rate (second flow rate) of rinse liquid supply through the rinse liquid nozzle 30 is set at, for example, 2.5 (liters/minute) as shown in FIG. 5A by controlling the rinse liquid flow rate control valve 33. Also, the flow rate (first flow rate) of rinse liquid supply through the lower surface nozzle 17 is set at, for example, 1.0 (liter/minute) as shown in FIG. 5B by controlling the lower rinse liquid flow rate control valve 25. In this case, the total flow rate of rinse liquid supply onto the substrate W is 3.5 (liters/minute) as shown in FIG. 5C, and the flow rate ratio of the flow rate of rinse liquid supply through the rinse liquid nozzle 30 to the flow rate of rinse liquid supply through the lower surface nozzle 17 is 2.5.

The rinse liquid supplied onto the central portion of the upper surface of the substrate W undergoes a centrifugal force due to the rotation of the substrate W to flow on the upper surface of the substrate W toward the peripheral portion of the substrate W. This causes the chemical solution film 61 maintained on the upper surface of the substrate W to be replaced with a rinse liquid film 71 as shown in FIG. 7. The rinse liquid film 71 covers the entire upper surface of the substrate W. Also, the rinse liquid supplied onto the central portion of the lower surface of the substrate W undergoes a centrifugal force due to the rotation of the substrate W to flow on the lower surface of the substrate W toward the peripheral portion of the substrate W. This causes the chemical solution film 62 maintained on the lower surface of the substrate W to be replaced with a rinse liquid film 72 as shown in FIG. 7. The rinse liquid film 72 covers the entire lower surface of the substrate W. The rinse liquid films 71 and 72 cause the chemical solution adhering to the upper surface and the lower surface of the substrate W to be rinsed off for rinse processing on the upper and lower surfaces of the substrate W. If diluted hydrofluoric acid, concentrated hydrofluoric acid, fluonitric acid, ammonium fluoride, or the like is used as the chemical solution, the upper surface of the substrate W begins to show hydrophobicity after the processing by the chemical solution. In the example of processing, even if the upper surface of the substrate W may show hydrophobicity, the rinse liquid film 71 covering the entire upper surface of the substrate W can be maintained on the upper surface of the substrate W. This allows for uniform replacement with the rinse liquid and washing of the substrate W, and the liquid film 71 can protect the entire upper surface of the substrate W from splattering liquid and the like.

As shown in FIG. 8, the rinse liquid flowing on the upper surface of the substrate W toward the peripheral portion comes into contact, in the peripheral portion of the substrate W, with the clamping member 16 rotating integrally with the spin base 15 and splatters laterally from the substrate W. Similarly, the rinse liquid flowing on the lower surface of the substrate W toward the peripheral portion also comes into contact, in the peripheral portion of the substrate W, with the clamping member 16 rotating integrally with the spin base 15 and then splatters laterally from the substrate W. The rinse liquid discharged through the peripheral portions of the substrate W thus comes into contact with the clamping member 16 to thereby undergo a change in the splattering direction.

The splattering direction of the rinse liquid moving on the lower surface of the substrate W and coming into contact with the clamping member 16 to splatter approximately follows an extended surface of the lower contact surface 53 of the clamping member 16. That is, the splattering direction $D_D$ of the rinse liquid moving on the lower surface of the substrate W and splattering from the peripheral portion of the lower surface of the substrate W (hereinafter referred to as "rinse liquid splattering from the peripheral portion of the lower surface of the substrate W") is inclined upward by the angle θ1 toward the outside in the radial direction with respect to the horizontal plane. On the other hand, the splattering direction of the rinse liquid moving on the upper surface of the substrate W and coming into contact with the clamping member 16 to splatter approximately follows an extended surface of the upper contact surface 54 of the clamping member 16. That is, the splattering direction $D_U$ of the rinse liquid moving on the upper surface of the substrate W and splattering from the peripheral portion of the upper surface of the substrate W (hereinafter referred to as "rinse liquid splattering from the peripheral portion of the upper surface of the substrate W") is inclined downward by the angle θ2 toward the outside in the radial direction with respect to the horizontal plane.

During the rinsing step (S4), in the peripheral portion of the substrate W, the flow of the rinse liquid splattering from the peripheral portion of the lower surface of the substrate W and the flow of the rinse liquid splattering from the peripheral portion of the upper surface of the substrate W intersect vertically. As a result, the rinse liquid splattering from the peripheral portion of the lower surface of the substrate W and the rinse liquid splattering from the peripheral portion of the upper surface of the substrate W interfere with each other in the peripheral portion of the substrate W. In the peripheral portion of the substrate W, the rinse liquid then splatters in the general splattering direction $D_1$ composed of the splattering direction $D_D$ of the rinse liquid splattering from the peripheral portion of the lower surface of the substrate W and the splattering direction $D_U$ of the rinse liquid splattering from the peripheral portion of the upper surface of the substrate W.

If the flow rate ratio of supply onto the upper and lower surfaces (upper surface:lower surface) were 1:1, the flow rate of the rinse liquid splattering from the peripheral portion of the upper surface of the substrate W would not be higher than the flow rate of the rinse liquid from the peripheral portion of the lower surface and, as shown in FIG. 9A, the rinse liquid from the peripheral portion of the lower surface of the substrate W splattering obliquely upward could not be suppressed sufficiently, resulting in that the general splattering direction $D_1$ of the rinse liquid would be inclined considerably upward toward the outside in the radial direction with respect to the horizontal plane.

In contrast, since the flow rate ratio of supply onto the upper and lower surfaces (upper surface:lower surface) is 2.5:1 in the example of processing shown in FIG. 3, the flow rate of the rinse liquid splattering from the peripheral portion of the upper surface of the substrate W is much higher than the flow rate of the rinse liquid from the peripheral portion of the lower surface. As a result, the rinse liquid splattering from the peripheral portion of the upper surface of the substrate W forces down the splattering direction of the rinse liquid splattering from the peripheral portion of the lower surface of the substrate W, as shown in FIG. 9B, resulting in that the general splattering direction $D_1$ of the rinse liquid approximately follows or becomes close to the horizontal direction with respect to the horizontal plane.

Accordingly, most of the rinse liquid splattering from the peripheral portions of the substrate W is received by the inner wall of the first guard 41. It is therefore possible to suppress or prevent the rinse liquid from flowing out of the processing cup 8 during the rinsing step (S4). The rinse liquid running down the inner wall of the first guard 41 collects at the bottom of the first cup 38 and is guided to the waste liquid unit (not shown) through the waste liquid pipe (not shown).

As shown in FIGS. 4 and 5A to 5C, the rinsing step (S4) includes a high-speed rinsing step (step S41) of rotating the substrate W at the liquid processing speed (rinse processing speed), a decelerating step (step S42) of continuously reducing the rotational speed of the substrate W from the liquid processing speed (800 rpm, for example) to a puddling speed (within the range from 0 to 100 rpm; 10 rpm as shown in FIG. 4, for example), and a puddling step (step S43) of maintaining a rinse liquid film in a puddle state on the entire upper surface of the substrate W.

When a predefined high-speed rinsing time (30 seconds, for example) has elapsed since the start of the discharge of the rinse liquid, the controller 9 starts performing the decelerating step (S42). Specifically, the controller 9 controls the spin motor 13 to rapidly decelerate the substrate W rotating at the liquid processing speed (800 rpm, for example) to about 100 rpm while keeping the flow rate of rinse liquid supply through the rinse liquid nozzle 30 and the lower surface nozzle 17, respectively, at 2.5 (liters/minute) and 1.5 (liters/minute).

During the decelerating step (S42), six stages are provided for stepwise deceleration from the liquid processing speed to the puddling speed. As shown in FIG. 4, deceleration is made from the liquid processing speed (about 800 rpm, for example) through a first state (about 300 rpm, for example), a second stage (about 100 rpm, for example), a third stage (about 50 rpm, for example), a fourth stage (about 30 rpm, for example), and a fifth stage (about 20 rpm, for example) in this order to the puddling speed (sixth stage; about 10 rpm, for example) in about 15 seconds.

When the rotational speed of the substrate W is reduced to the puddling speed (10 rpm), the controller 9 controls the spin motor 13 to keep the rotational speed of the substrate W at the puddling speed. The puddling step (S43) is thus performed to maintain a rinse liquid film in a puddle state on the entire upper surface of the substrate W.

When a predefined puddle rinsing time (6 seconds, for example) has elapsed since the reduction of the rotational speed of the substrate W to the puddling speed (10 rpm), the controller 9 closes the rinse liquid valve 32 and the lower rinse liquid valve 24 to stop the discharge of the rinse liquid through the rinse liquid nozzle 30 and the lower surface nozzle 17.

Subsequently, the controller 9 starts performing an IPA replacing step (step S5). Specifically, the controller 9 opens the organic solvent valve 36, while keeping the rotational speed of the substrate W at the puddling speed, to discharge IPA liquid through the organic solvent nozzle 34 toward the central portion of the upper surface of the substrate W. In this case, the flow rate of IPA supply through the organic solvent nozzle 34 is set at, for example, 0.1 (liters/minute). IPA is supplied onto the upper surface of the substrate W, which in turn causes the rinse liquid contained in the liquid film on the upper surface of the substrate W to be replaced sequentially with the IPA. This results in an IPA liquid film covering the entire upper surface of the substrate W to be maintained in a puddle state on the upper surface of the substrate W.

When a predefined IPA puddling time (about 8 seconds, for example) has elapsed since the start of the discharge of IPA, the controller 9 controls the spin motor 13, while continuing to discharge IPA, to accelerate the substrate W from the puddling speed to a high rotational speed (about 1000 rpm, for example) through four stages, for example (10 rpm, 50 rpm, 100 rpm, 500 rpm, 1000 rpm). After the substrate W reaches the high rotational speed, under the condition that a predetermined time has elapsed since the start of the discharge of IPA, the controller 9 closes the organic solvent valve 36 to stop the discharge of IPA through the organic solvent nozzle 34.

When the discharge of IPA is stopped, the controller 9 performs a drying step (step S6). That is, the controller 9 keeps the rotational speed of the substrate W at, for example, 1000 rpm. This causes the IPA adhering to the substrate W to be spun off and the substrate W to be dried.

After the drying step (S6) for a predefined drying time is performed, the controller 9 drives the spin motor 13 to stop the rotation of the spin chuck 3 (rotation of the substrate W) (step S7). The cleaning processing for one substrate W is thus completed and the delivery robot carries the processed substrate W out of the processing chamber 2 (step S8).

As described heretofore, in accordance with this preferred embodiment, the splattering direction of the processing liquid (chemical solution or rinse liquid) moving on the lower surface of the substrate W and coming into contact with the clamping member 16 to splatter approximately follows an extended surface of the lower contact surface 53 of the clamping member 16. That is, the splattering direction of the processing liquid splattering from the peripheral portion of the lower surface of the substrate W is inclined upward toward the outside in the radial direction with respect to the horizontal plane.

On the other hand, the splattering direction of the processing liquid moving on the upper surface of the substrate W and coming into contact with the clamping member 16 to splatter approximately follows an extended surface of the upper contact surface 54 of the clamping member 16. That is, the splattering direction of the processing liquid splattering from the peripheral portion of the upper surface of the substrate W is inclined downward toward the outside in the radial direction with respect to the horizontal plane. As a result, the processing liquid splattering from the peripheral portion of the lower surface of the substrate W and the processing liquid splattering from the peripheral portion of the upper surface of the substrate W interfere with each other in the peripheral portion of the substrate W.

Since the flow rate ratio of the flow rate of processing liquid supply onto the upper surface of the substrate W to the flow rate of processing liquid supply onto the lower surface of the substrate W is 2.5, the processing liquid splattering from the peripheral portion of the upper surface of the substrate W limits the splattering direction of the processing liquid splattering from the peripheral portion of the lower surface of the substrate W. As a result, it is possible to force down the general splattering direction $D_1$ of the processing liquid.

It is therefore possible for the processing cup 8 to reliably receive the processing liquid splattering from the peripheral portions of the substrate W and thereby to suppress or prevent the processing liquid from flowing out of the processing cup 8.

Meanwhile, since the inclined portions 46 of the guards 41 to 44 are each provided in a manner extending obliquely upward from the upper end of each guide portion 47 toward the center (toward the rotational axis A1 of the substrate W), if the splattering direction of the processing liquid from the peripheral portions of the substrate W is angled too upward, the processing liquid impinging on the inner wall of each inclined portion 46 may splash toward the substrate W and thus droplets of the processing liquid may fall on the upper surface of the substrate.

In contrast, in this preferred embodiment, since the general splattering direction of the processing liquid splattering from the peripheral portions of the substrate W is thus forced down, it is possible to suppress droplets of the processing liquid from splashing toward the substrate W due to impingement on the processing cup 8. It is therefore possible to suppress or prevent contamination of the substrate W due to adherence of droplets of the processing liquid to the substrate W.

In addition, since the flow rate of processing liquid (chemical solution or rinse liquid) supply onto the lower surface of the substrate W is 1.0 (liter/minute) and the liquid processing speed is 800 (rpm) during the chemical solution step (S3) and the high-speed rinsing step (S41) in the example of processing, the processing liquid covering the entire lower surface of the substrate W can be maintained on the lower surface. Further, compared to the case where the rotational speed of the substrate W is high (1200 rpm, for example) as indicated by the dashed line in FIG. 4, it is possible to further suppress the processing liquid from flowing out of the processing cup 8 and splashing of the processing liquid toward the substrate W.

Meanwhile, if the flow rate ratio of the flow rate of processing liquid supply onto the upper surface of the substrate W to the flow rate of processing liquid supply onto the lower surface of the substrate W is 1 during the chemical solution step (S3) and the high-speed rinsing step (S41) in the example of processing, the rotational speed of the substrate W needs to be high (1200 rpm, for example) as indicated by the dashed line in FIG. 4 and the flow rate of processing liquid supply onto the upper and lower surfaces of the substrate W needs to be at least 2.0 (liters/minute) to maintain the processing liquid films 61 and 71 covering the entire upper surface of the substrate W on the upper surface. In this case, the required flow rate of processing liquid supply is 4.0 (liters/minute) in total for the upper and lower surfaces as indicated by the dashed line in FIG. 5C.

In contrast, during the chemical solution step (S3) and the high-speed rinsing step (S41) in the example of processing, the required flow rate of processing liquid supply is only 3.5 (liters/minute) in total for the upper and lower surfaces as indicated by the solid line in FIG. 5C. It is therefore possible to maintain the processing liquid films 61, 62, 71, and 72 on the entire upper and lower surfaces of the substrate W while reducing the amount of processing liquid consumption.

The substrate processing apparatus 1 can thus be provided for high-quality substrate processing with a reduced amount of chemical solution and rinse liquid consumption.

While the above description is based on the exemplary case where the liquid processing speed is 800 rpm during the chemical solution step (S3) and the high-speed rinsing step (S41) in the example of processing, the liquid processing speed is preferably set equal to or higher than 800 rpm but equal to or lower than 1200 rpm.

Also, the flow rate ratio of the flow rate of processing liquid supply onto the upper surface of the substrate W to the flow rate of processing liquid supply onto the lower surface of the substrate W is desirably 1.5 or higher to force down the general splattering direction $D_1$ of the processing liquid splattering from the peripheral portions of the substrate W during the chemical solution step (S3) and the high-speed rinsing step (S41) in the example of processing. However, the flow rate ratio of the flow rate of processing liquid supply onto the upper surface of the substrate W to the flow rate of processing liquid supply onto the lower surface of the substrate W may be lower than 1.5 as long as it is higher than 1.0.

Further, the flow rate of processing liquid supply onto the lower surface of the substrate W is desirably 1.0 (liter/minute) or higher but may be lower than 1.0 (liter/minute) to maintain the processing liquid films 62 and 72 covering the entire lower surface of the substrate w on the lower surface during the chemical solution step (S3) and the high-speed rinsing step (S41) in the example of processing.

Figure 10:
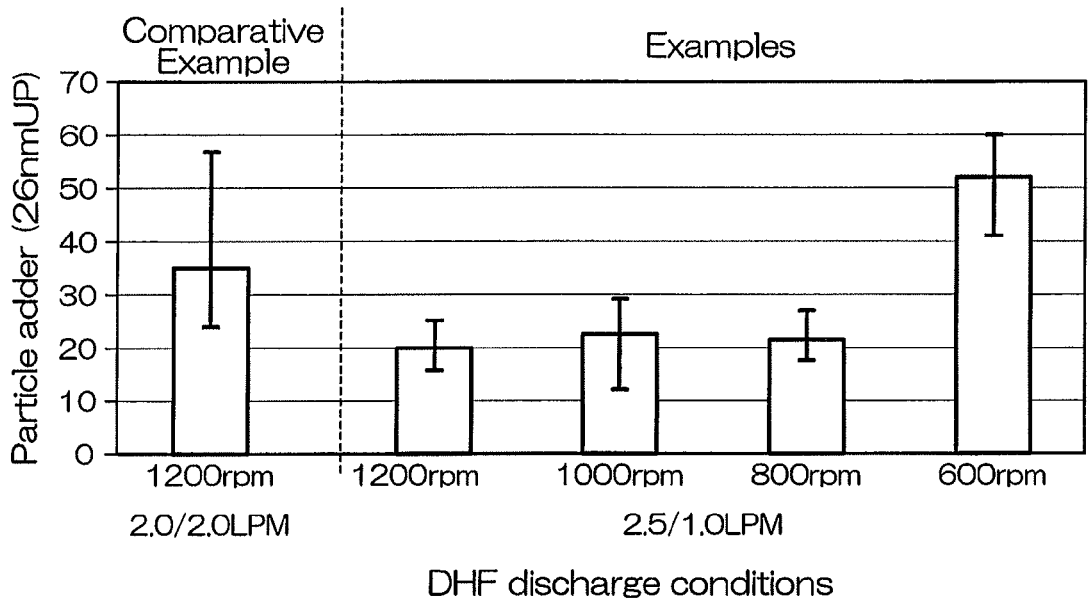
FIG. 10 shows results of a first test.
Figure 11:
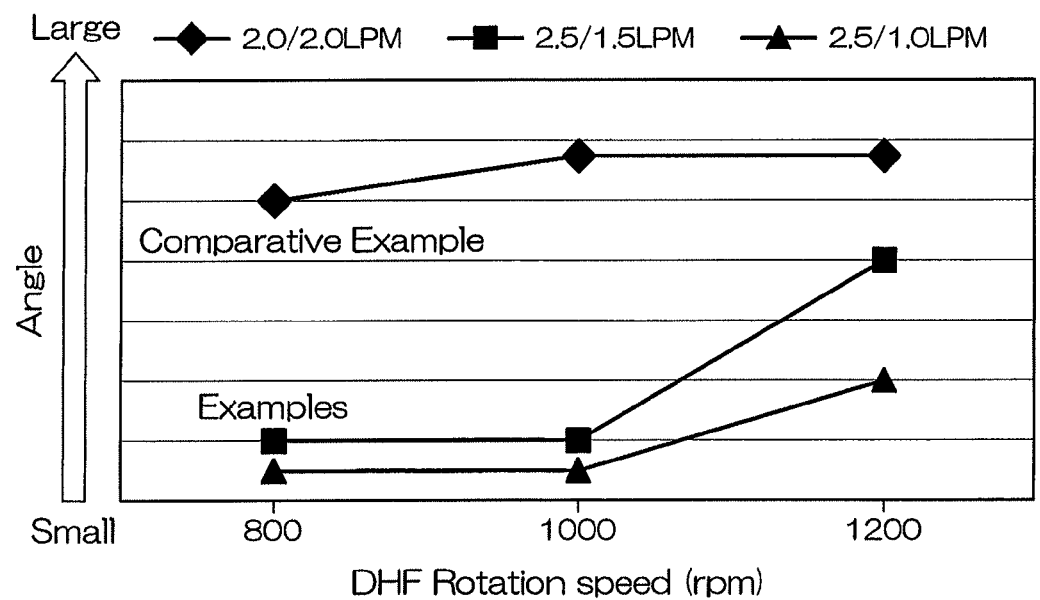
FIG. 11 shows results of a second test.
Figure 12:
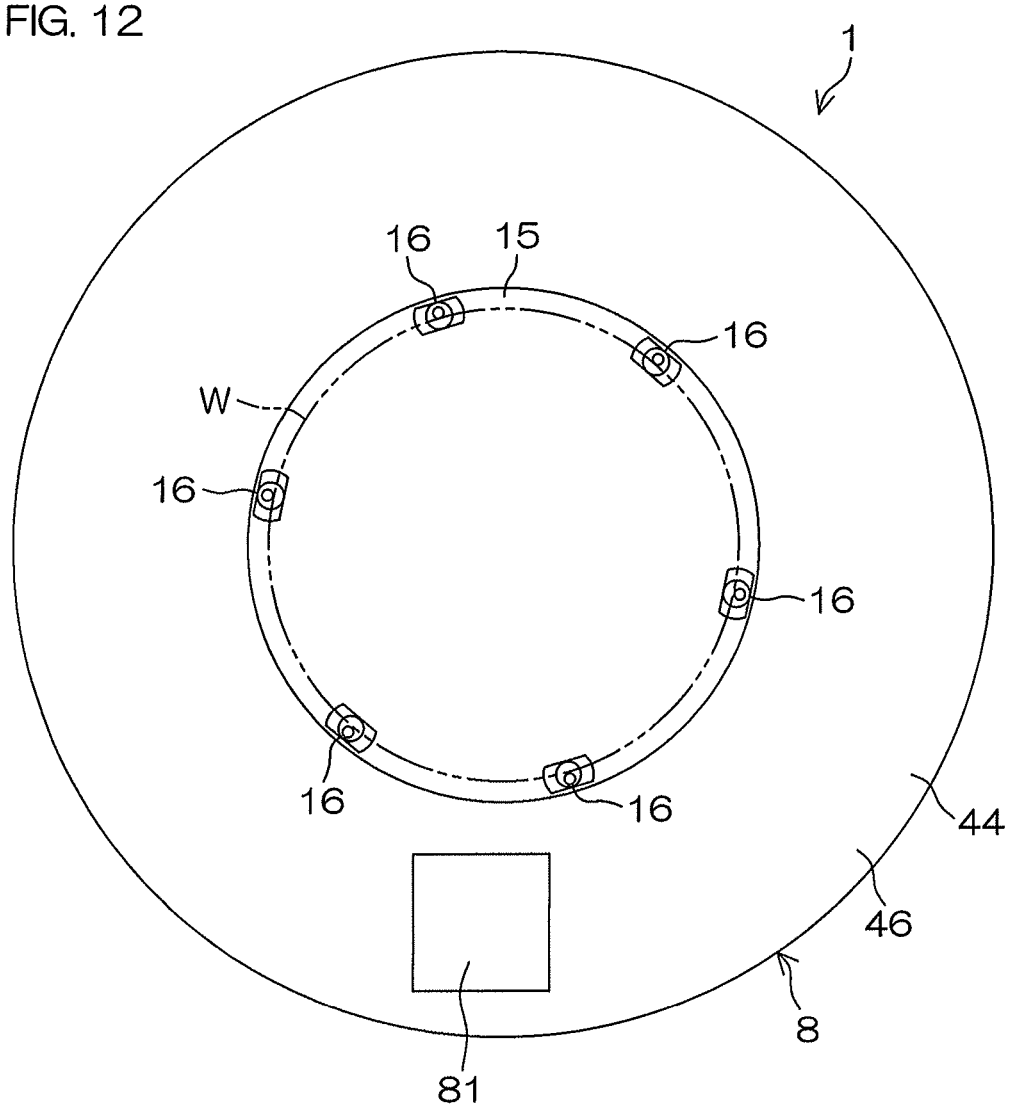
FIG. 12 is a plan view for illustrating the position of arrangement of a test strip on an inclined portion in the second test.
Figure 13:
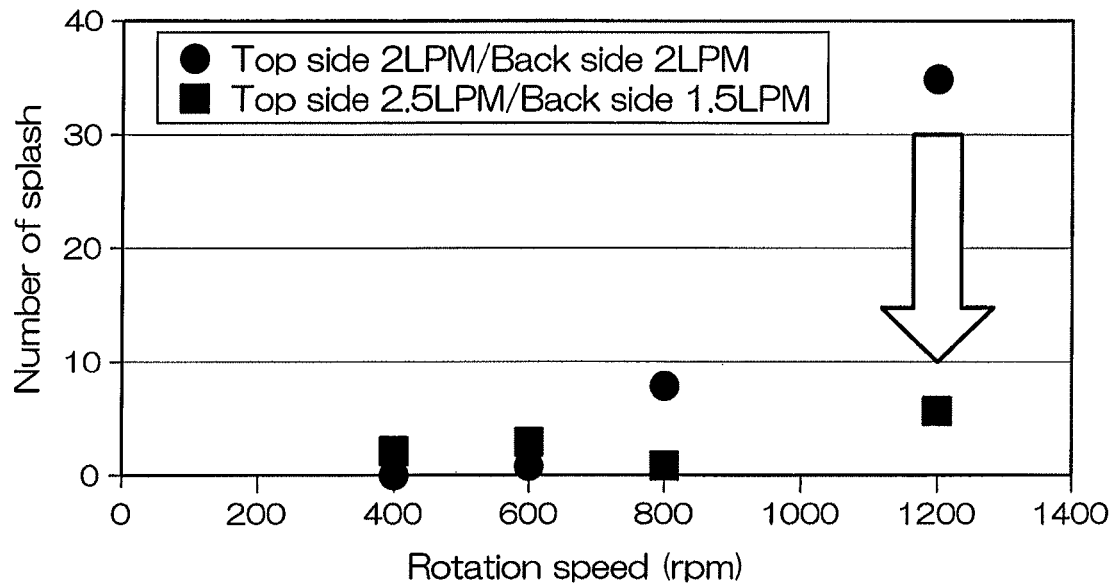
FIG. 13 shows results of a third test.
Figure 14:
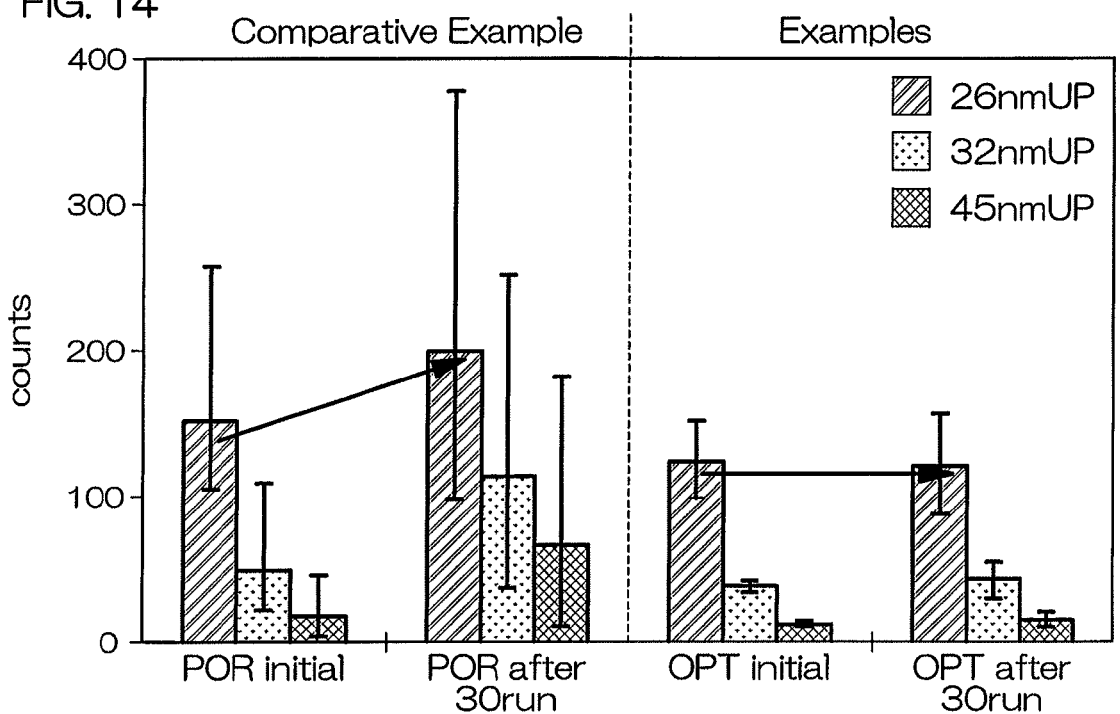
FIG. 14 shows results of a fourth test.
Figure 15:
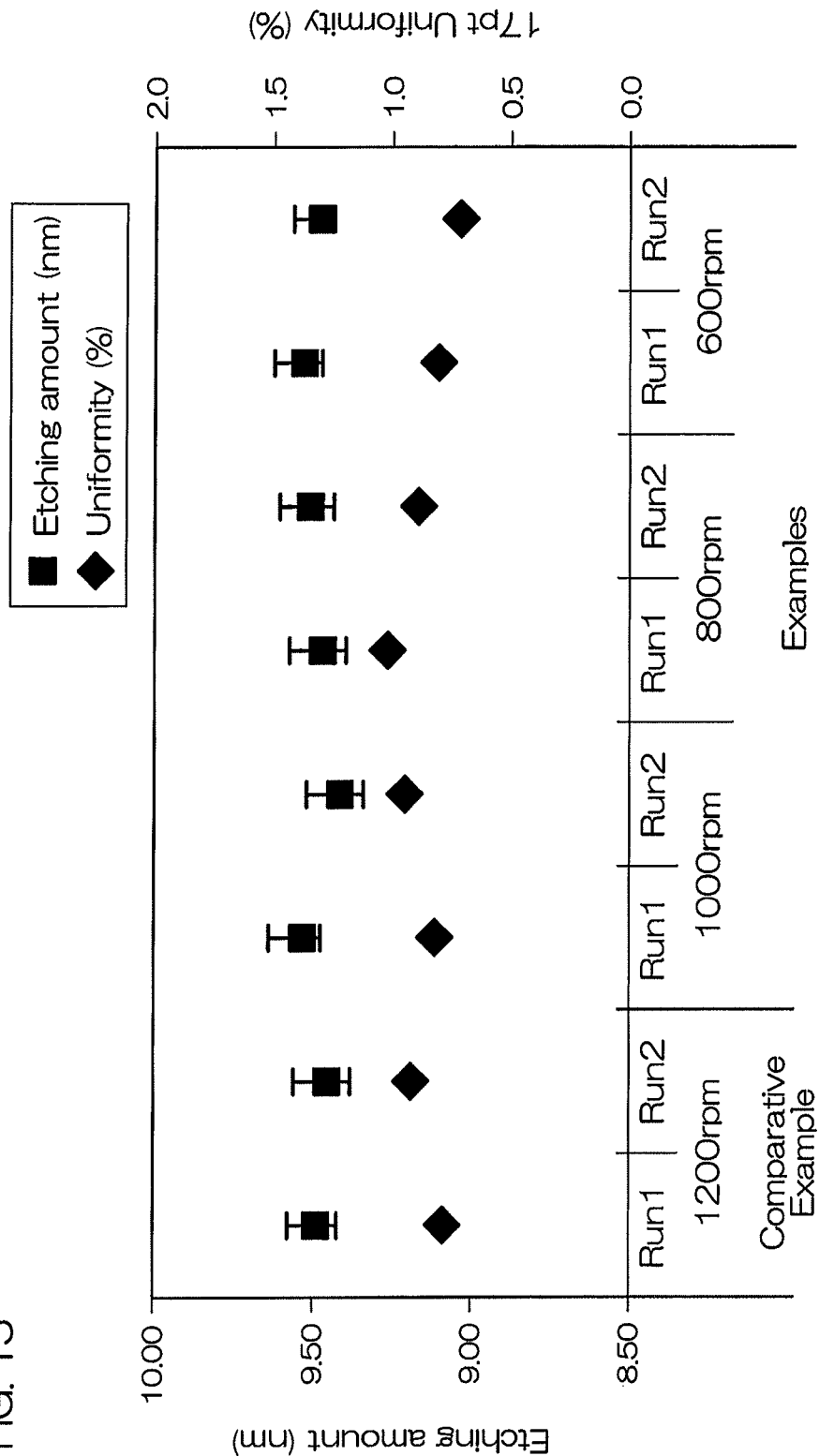
FIG. 15 shows results of a fifth test.
Figure 16:
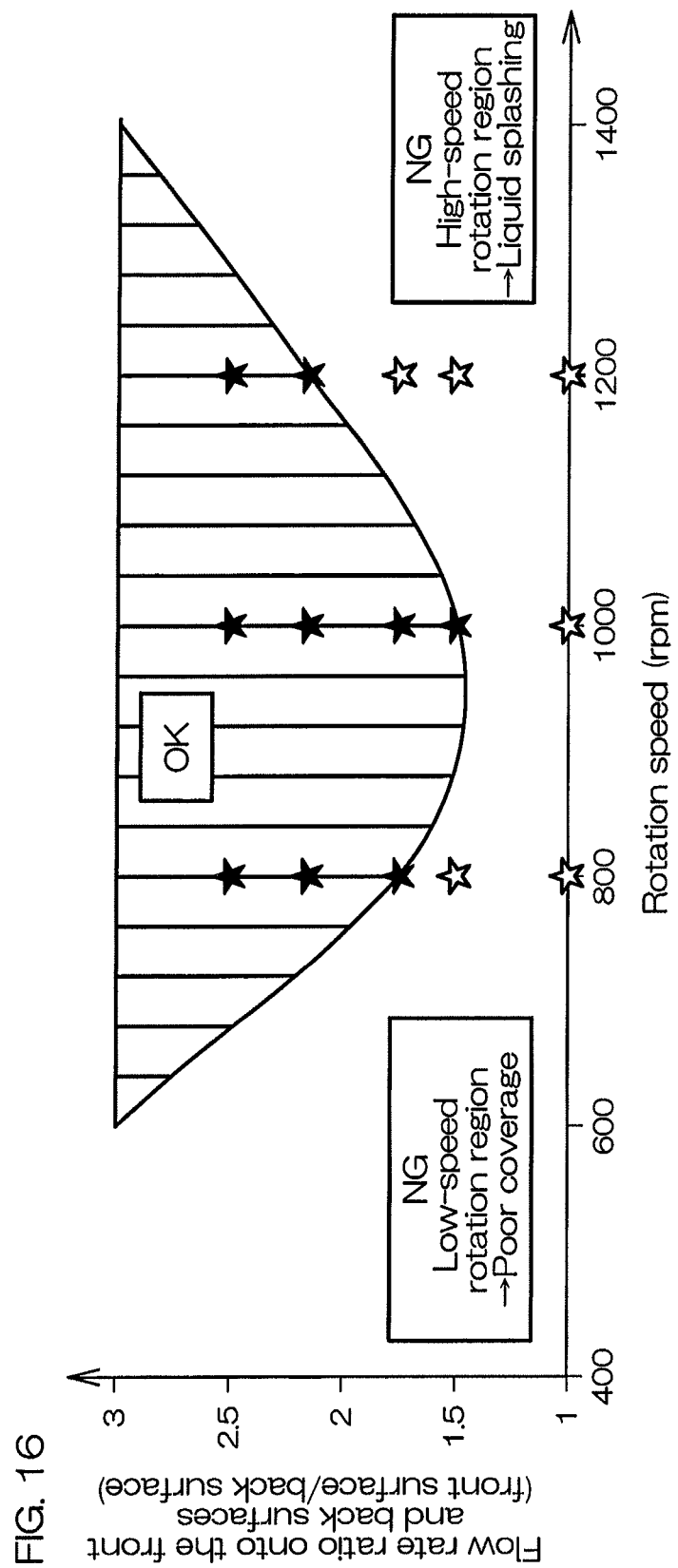
FIG. 16 shows results of a sixth test.

Next will be described first to seventh tests. FIG. 10 shows results of the first test. FIG. 11 shows results of the second test. FIG. 12 is a plan view for illustrating the position of arrangement of a test strip on an inclined portion 46 in the second test. FIG. 13 shows results of the third test. FIG. 14 shows results of a fourth test. FIG. 15 shows results of a fifth test. FIG. 16 shows results of a sixth test. FIG. 17 shows results of a seventh test. In each of the first to fifth tests among the first to seventh tests, etching processing according to Examples and a Comparative Example described below was performed on a sample.

EXAMPLES

A silicon wafer (having an outside diameter of 300 (mm)) with an oxide film formed on a surface thereof was employed as a sample and diluted hydrofluoric acid was employed as chemical solution. On the sample held on the spin chuck 3 and rotated, the etching processing shown in FIGS. 3 to 5C was performed using the substrate processing apparatus 1. That is, the flow rate of processing liquid (chemical solution or rinse liquid) supply onto the lower surface of the substrate W was 1.0 (liter/minute; LPM) and the flow rate of processing liquid supply onto the upper surface of the substrate W was 2.5 (liter/minute), unless otherwise stated.

Comparative Example

A silicon wafer (having an outside diameter of 300 (mm)) with an oxide film formed on a surface thereof was employed as a sample and diluted hydrofluoric acid was employed as chemical solution. On the sample held on the spin chuck 3 and rotated, the etching processing was performed using the substrate processing apparatus 1. In the processing according to the Comparative Example, the flow rate of processing liquid (chemical solution or rinse liquid) supply onto the lower surface of the substrate W was 2.0 (liter/minute) and the flow rate of processing liquid supply onto the upper surface of the substrate W was 2.0 (liter/minute), which is different from, but otherwise in common with, the Examples of processing.

<First Test>

In the first test, the number of particles having a size equal to or larger than 26 nm on the surface of the substrate W after the etching processing was measured in the Examples and the Comparative Example.

In the Examples, the rotational speed of the substrate W during the chemical solution step (S3) and the high-speed rinsing step (S41) was changed among 600 rpm, 800 rpm, 1000 rpm, and 1200 rpm.

In the Comparative Example, the rotational speed of the substrate W during the chemical solution step (S3) and the high-speed rinsing step (S41) was 1200 rpm.

Results of the first test are shown in FIG. 10. FIG. 10 shows the relationship between the rotational speed of the substrate W and the number of particles (Particle Adder) on the surface of the substrate W in the Examples and the Comparative Example.

As shown in FIG. 10, in the Examples in which the rotational speed of the substrate W during the chemical solution step (S3) and the high-speed rinsing step (S41) was 800 rpm, 1000 rpm, and 1200 rpm, the number of particles after the etching processing was small.

In contrast, in the Example in which the rotational speed of the substrate W during the chemical solution step (S3) and the high-speed rinsing step (S41) was 600 rpm, the number of particles after the etching processing was large. Also in the Comparative Example, the number of particles after the etching processing was large.

It is found from FIG. 10 that it is possible in the Examples to curb the generation of particles after the etching processing. It is also found that if the rotational speed of the substrate W is lower than 800 rpm, it is not possible even in the Examples to sufficiently curb the generation of particles after the etching processing. It is inferable that if the rotational speed of the substrate W during the chemical solution step (S3) and the high-speed rinsing step (S41) is lower than 800 rpm, a crack or the like may occur in the liquid films 61 and 71 on the upper surface of the substrate W during the chemical solution step (S3) and the high-speed rinsing step (S41) and the upper surface (front surface) of the substrate W may partially be exposed, resulting in that particles floating around the upper surface of the substrate W may adhere to the upper surface of the substrate W.

<Second Test>

In the second test, the splattering direction of chemical solution (diluted hydrofluoric acid (DHF)) splattering from the peripheral portions of the substrate W was measured when the rotational speed of the substrate W during the chemical solution step (S3) was changed among 800 rpm, 1000 rpm, and 1200 rpm in the Examples and the Comparative Example.

Results of the second test are shown in FIG. 11. FIG. 11 shows the relationship between the rotational speed of the substrate W (DHF Rotation speed) and the angle of the splattering direction of the chemical solution splattering from the peripheral portions of the substrate W to the horizontal plane (Angle) in the Examples and the Comparative Example.

As shown in FIG. 11, in the Examples in which the rotational speed of the substrate W was 800 rpm and 1000 rpm, the splattering direction of the chemical solution splattering from the peripheral portions of the substrate W was close to the horizontal plane. Also in the Example in which the rotational speed of the substrate W was 1200 rpm, the splattering direction of the chemical solution splattering from the peripheral portions of the substrate W was obliquely upward but had a small angle to the horizontal plane.

On the other hand, in the Comparative Example, the splattering direction of the chemical solution splattering from the peripheral portions of the substrate W was obliquely upward and had a large angle to the horizontal plane.

It is found from FIG. 11 that compared to the Comparative Example, it is possible in the Examples to force down the splattering direction of the chemical solution splattering from the peripheral portions of the substrate W. Particularly, if the rotational speed of the substrate W is 800 to 1000 rpm, it is possible, compared to the Comparative Example, to significantly force down the splattering direction of the chemical solution splattering from the peripheral portions of the substrate W.

<Third Test>

In the third test, the amount of chemical solution (diluted hydrofluoric acid) flowing out of the processing cup 8 during the chemical solution step (S3) was measured in the Examples and the Comparative Example.

As shown in FIG. 12, a ph test strip 81 with a size of 50 cm×50 cm was disposed on the outer surface of the inclined portion 46 of the fourth guard 44. The number of points of color change due to adherence of the chemical solution to the ph test strip 81 after the etching processing was counted as the number of droplets of the chemical solution splattering (flowing) out of the processing cup 8.

In the third test, the flow rate of chemical solution supply onto the lower surface of the substrate W was 1.5 (liters/minute) and the flow rate of chemical solution supply onto the upper surface of the substrate W was 2.5 (liters/minute), and the rotational speed of the substrate W during the chemical solution step (S3) was changed among 400 rpm, 600 rpm, 800 rpm, and 1200 rpm.

Results of the third test are shown in FIG. 13. FIG. 13 shows the relationship between the rotational speed of the substrate W (Rotation speed) and the number of droplets of the chemical solution splattering out of the processing cup 8 in the Examples and the Comparative Example.

As shown in FIG. 13, if the rotational speed of the substrate W was 400 rpm, 600 rpm, and 800 rpm, the amount of chemical solution flowing out of the processing cup 8 was small in both the Examples and the Comparative Example.

On the other hand, if the rotational speed of the substrate W was 1200 rpm, the amount of chemical solution flowing out of the processing cup 8 was relatively small in the Examples, while the chemical solution flowed out of the processing cup 8 in a larger amount in the Comparative Example.

It is found from FIG. 13 that it is possible in the Examples to reduce the amount of chemical solution flowing out of the processing cup 8 regardless of the rotational speed of the substrate W. Particularly if the rotational speed of the substrate W is high, it is possible, compared to the Comparative Example, to significantly reduce the amount of chemical solution flowing out of the processing cup 8.

<Fourth Test>

In the fourth test, the number and size of particles on the surface of the substrate W were measured after etching processing on one substrate W (initial) and after continuous etching processing on 30 substrates W (after 30 run) in the Examples and the Comparative Example.

In the fourth test, the rotational speed of the substrate W during the chemical solution step (S3) and the high-speed rinsing step (S41) was 1000 rpm and 1200 rpm in the Examples (OPT) and the Comparative Example (POR).

Results of the fourth test are shown in FIG. 14. In FIG. 14, the size of particles on the surface of the substrate W is classified into 26 nm or larger, 32 nm or larger, and 45 nm or larger.

As shown in FIG. 14, no noticeable difference in the number and size of particles on the surface of the substrate W was observed between after processing on one substrate W and after continuous processing on 30 substrates W in the Examples.

On the other hand, in the Comparative Example, the number of particles, particularly of smaller size, on the surface of the substrate W increased after continuous processing on 30 substrates W compared to after processing on one substrate W.

It is found from FIG. 14 that in the Examples, the likelihood of particle generation on the surface of the substrate W remains unchanged even with an increase in the number of etching processing on the substrate W. This leads to an inference that in the Examples, the chemical solution (chemical solution (diluted hydrofluoric acid) mist) hardly floated outside the processing cup 8 (in the processing chamber 2).

<Fifth Test>

In the fifth test, the etching amount and uniformity after etching processing were measured in the Examples and the Comparative Example.

In the Examples, the rotational speed of the substrate W during the chemical solution step (S3) and the high-speed rinsing step (S41) was changed among 600 rpm, 800 rpm, and 1000 rpm.

In the Comparative Example, the rotational speed of the substrate W during the chemical solution step (S3) and the high-speed rinsing step (S41) was 1200 rpm.

Measurements were made two times for each condition (Run1 and Run2 in FIG. 15).

Results of the fifth test are shown in FIG. 15. FIG. 15 shows the etching amount (Etching amount (nm)) and the etching uniformity at 17 points (17 pt Uniformity (%)) in the Examples and the Comparative Example.

It is found from FIG. 15 that in the Examples, the etching amount neither increases nor decreases and the etching uniformity does not deteriorate, as is the case in the Comparative Example.

<Sixth Test>

In the sixth test, a silicon wafer (having an outside diameter of 300 (mm)) with an oxide film formed on a surface thereof was employed as a sample and diluted hydrofluoric acid was employed as chemical solution. On the sample held on the spin chuck 3 and rotated, the chemical solution step (S3) of the etching processing was performed using the substrate processing apparatus 1. The combination of the flow rates of chemical solution supply onto the upper surface of the substrate W and the lower surface of the substrate W was then changed among "2.5 (liters/minute) and 1.0 (liter/minute)," "2.25 (liters/minute) and 1.0 (liter/minute)," "2.5 (liters/minute) and 1.5 (liters/minute)," "2.25 (liters/minute) and 1.5 (liters/minute)," and "2.0 (liters/minute) and 2.0 (liters/minute)."

Results of the sixth test are shown in FIG. 16. FIG. 16 shows the relationship between the rotational speed of the substrate W and the flow rate ratio of supply onto the upper and lower surfaces of the substrate W. In FIG. 16, processing conditions under which few or only a few particles were generated are indicated by the solid stars, while processing conditions under which a relatively large number of particles were generated are indicated by the hollow stars.

It is found from FIG. 16 that etching processing under a processing condition included in the hatched region in FIG. 16 allows the processed substrate W to have high quality.

<Seventh Test>

In the seventh test, a silicon wafer (having an outside diameter of 300 (mm)) was employed as a sample and, on the sample held on the spin chuck 3 and rotated, chemical solution (diluted hydrofluoric acid) was supplied onto only the lower surface of the substrate W using the substrate processing apparatus 1, where the flow rate of chemical solution supply was changed among 1.0 (liter/minute), 1.5 (liters/minute), and 2.0 (liters/minute). Diluted hydrofluoric acid was employed as the chemical solution. In addition, the rotational speed of the substrate W during the chemical solution step (S3) was changed among 400 rpm, 500 rpm, 600 rpm, 800 rpm, and 1200 rpm.

Results of the seventh test are shown in FIG. 17. In FIG. 17, cases where a chemical solution film 72 covering the entire lower surface of the substrate W was formed on the lower surface are expressed as "Good," while cases where at least a portion of the lower surface was not covered with a chemical solution film are expressed as "Insufficient."

It is found from FIG. 17 that if the flow rate of chemical solution onto the lower surface of the substrate W is 1.0 (liter/minute) or higher and the rotational speed of the substrate W is 500 rpm or higher, a chemical solution film 72 covering the entire lower surface of the substrate W can be formed on the lower surface.

Although the preferred embodiment of the present invention has heretofore been described, the present invention may be embodied in other forms.

For example, in the chemical solution step (S3) in the example of processing, chemical solution (diluted hydrofluoric acid) may be supplied onto the upper surface of the substrate W, while water (DIW, for example) may be supplied onto the lower surface of the substrate W. Also in this case, the flow rate of chemical solution supply onto the upper surface of the substrate W is higher than the flow rate of water supply onto the lower surface of the substrate W and, more preferably, the flow rate ratio of the flow rate of chemical solution supply onto the upper surface of the substrate W to the flow rate of water supply onto the lower surface of the substrate W is 1.5 or higher.

Also, besides IPA, methanol, ethanol, acetone, or HFE (hydrofluoroether) may be employed as an example of organic solvent with low surface tension.

Further, organic solvent replacing steps such as the IPA replacing step (S5) may be skipped.

In addition, the present invention can be applied widely to other etching processing, cleaning processing, etc., without limiting to such etching processing in which a silicon dioxide film is removed from the surface of the substrate W. However, the advantages of the present invention are produced particularly prominently in the case where the surface of the substrate W shows hydrophobicity. Besides silicon dioxide film removing processing, resist removing processing can be exemplified as processing for substrates W with surface hydrophobicity.

Although it is desirable, also during the high-speed rinsing step (S41), that the flow rate of rinse liquid supply onto the upper surface of the substrate W is higher than the flow rate of supply onto the lower surface of the substrate W so that the upper and lower surfaces of the substrate W can be covered successively as in the example of processing, the flow rates of rinse liquid supply onto the upper and lower surfaces of the substrate W may be nearly equal to each other or the flow rate of rinse liquid supply onto the lower surface of the substrate W may be higher than the flow rate of supply onto the upper surface of the substrate W during the high-speed rinsing step (S41).

Various other design changes are possible within the scope as described in the appended claims.

While preferred embodiments of the present invention have heretofore been described in detail, these are merely specific examples used to clarify the technical contents of the present invention, and the present invention should not be interpreted as being limited only to these specific examples. The scope of the present invention shall be limited only by the appended claims.

This application corresponds to Japanese Patent Application No. 2014-105471 filed on May 21, 2014 in the Japan Patent Office, the disclosure of which is incorporated herein by reference in its entirety.

What is claimed is:

1. A substrate processing method to be implemented in a substrate processing apparatus including a substrate holding and rotating unit having a spin base rotatable about a predetermined vertical axis and a plurality of substrate support members provided in a manner rotatable together with the spin base and arranged to come into contact with the peripheral end edge of the substrate to support the substrate thereon, the substrate holding and rotating unit arranged to rotate the substrate about the vertical axis while holding the substrate horizontally, and a processing cup surrounding the substrate holding and rotating unit and arranged to receive processing liquid splattering from the substrate rotated by the substrate holding and rotating unit, the substrate processing method comprising:

a substrate rotating step of rotating the spin base to rotate the substrate about the vertical axis at a predetermined liquid processing speed;

in parallel with the substrate rotating step, a first processing liquid discharging step of discharging processing liquid from a first nozzle onto a center portion of the lower surface of the substrate; and in parallel with the substrate rotating step and the first processing liquid discharging step, a second processing liquid discharging step of discharging processing liquid from a second nozzle onto a center portion of the upper surface of the substrate,
wherein the discharge flow rate of the processing liquid from the second nozzle in the second processing liquid discharge step is set to be higher than the discharge flow rate of the processing liquid from the first nozzle in the first processing liquid discharge step, so that the general splattering direction of the processing liquid at the peripheral portion of the substrate is controlled by the interference between the processing liquid splattering from the peripheral portion of the lower surface of the substrate, so that the processing liquid splattering direction from the peripheral portion of the upper surface of the substrate is lower than when the discharge flow rate of the processing liquid from the first nozzle in the first processing liquid discharge step is equal to the discharge flow rate of the processing liquid from the second processing liquid in the second processing liquid discharge step.

2. The substrate processing method according to claim 1, wherein the liquid processing speed and the second flow rate are set such that the entire lower surface of the substrate can be covered with a film of processing liquid.

3. The substrate processing method according to claim 1, wherein the first flow rate is 1.0 liter/minute or higher.

4. The substrate processing method according to claim 1, wherein the flow rate ratio of the second flow rate to the first flow rate is 1.5 or higher.

5. The substrate processing method according to claim 1, wherein the liquid processing speed is equal to or higher than 800 rpm but equal to or lower than 1200 rpm.

6. The substrate processing method according to claim 1, wherein the processing liquid includes an etching liquid.

7. The substrate processing method according to claim 1, wherein the substrate support members each have a clamping portion defined by a first contact surface to be in contact with the peripheral edge of the lower surface of the substrate and a second contact surface to be in contact with the peripheral edge of the upper surface of the substrate, and wherein the first contact surface is inclined upward toward the outside in the rotational radial direction of the substrate with respect to the horizontal plane, and wherein the second contact surface is inclined downward toward the outside in the rotational radial direction of the substrate with respect to the horizontal plane.

8. The substrate processing method according to claim 1, wherein the liquid processing speed is equal to or higher than 800 rpm.

9. A substrate processing method to be implemented in a substrate processing apparatus including a substrate holding and rotating unit having a spin base rotatable about a predetermined vertical axis and a plurality of substrate support members provided in a manner rotatable together with the spin base and arranged to come into contact with the peripheral end edge of the substrate to support the substrate thereon, the substrate holding and rotating unit arranged to rotate the substrate about the vertical axis while holding the substrate horizontally, and a processing cup surrounding the substrate holding and rotating unit and arranged to receive processing liquid splattering from the substrate rotated by the substrate holding and rotating unit, the substrate processing method comprising:
  a substrate rotating step of rotating the spin base to rotate the substrate about the vertical axis at a predetermined liquid processing speed;
  in parallel with the substrate rotating step, a processing liquid supply step of supplying processing liquid to the substrate; and
  in parallel with the substrate rotating step and the processing liquid supply step, a rinse liquid supply step of supplying rinse liquid to the substrate;
  wherein the processing liquid supply step includes a first processing liquid discharging step of discharging processing liquid onto a center portion of the lower surface of the substrate at a predetermined first flow rate, and a second processing liquid discharging step of discharging processing liquid onto a center portion of the upper surface of the substrate at a second flow rate that is higher than the first flow rate,
  wherein the rinse liquid supply step includes a first rinse liquid discharging step of discharging rinse liquid onto a center portion of the lower surface of the substrate at a predetermined third flow rate, and a second rinse liquid discharging step of discharging rinse liquid onto a center portion of the upper surface of the substrate at a fourth flow rate that is higher than the third flow rate.

10. The substrate processing method according to claim 9, wherein the liquid processing speed is equal to or higher than 800 rpm.

* * * * *